(12) United States Patent
Kang et al.

(10) Patent No.: US 11,409,193 B2
(45) Date of Patent: Aug. 9, 2022

(54) RETICLE IN AN APPARATUS FOR EXTREME ULTRAVIOLET EXPOSURE

(71) Applicant: SAMSUNG ELECTRONICS CO., LTD., Suwon-si (KR)

(72) Inventors: Mankyu Kang, Suwon-si (KR); Hoon Kim, Suwon-si (KR); Jongkeun Oh, Seoul (KR); Minho Kim, Yongin-si (KR); Heebom Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 17/028,049

(22) Filed: Sep. 22, 2020

(65) Prior Publication Data

US 2021/0302825 A1    Sep. 30, 2021

(30) Foreign Application Priority Data

Mar. 27, 2020  (KR) .................. 10-2020-0037307

(51) Int. Cl.
*G03F 1/24* (2012.01)
*G03F 1/22* (2012.01)

(52) U.S. Cl.
CPC . *G03F 1/24* (2013.01); *G03F 1/22* (2013.01)

(58) Field of Classification Search
USPC .......................................................... 430/5
See application file for complete search history.

(56) References Cited

U.S. PATENT DOCUMENTS

| | | | |
|---|---|---|---|
| 7,927,770 B2 | 4/2011 | Kanamitsu | |
| 8,105,735 B2 | 1/2012 | Kinoshita | |
| 9,953,833 B2 | 4/2018 | Tu et al. | |
| 10,007,174 B2 | 6/2018 | Shih et al. | |
| 2004/0131947 A1 | 7/2004 | Fisch Gallagher et al. | |
| 2019/0004416 A1 | 1/2019 | Wang et al. | |
| 2019/0101817 A1 | 4/2019 | Lin | |

FOREIGN PATENT DOCUMENTS

KR    10-2011-0091217 A    8/2011

*Primary Examiner* — Christopher G Young
(74) *Attorney, Agent, or Firm* — Lee IP Law, P.C.

(57) ABSTRACT

A reticle for an apparatus for EUV exposure and a method of manufacturing a reticle, the reticle including a substrate including an edge region and a main region; a multi-layer structure on the main region and the edge region, a sidewall of the multi-layer structure overlying the edge region; a capping layer covering an upper surface and the sidewall of the multi-layer structure and at least a portion of the edge region of the substrate; and an absorber layer on the capping layer, the absorber layer covering an entire upper surface of the capping layer on the edge region of the substrate, wherein a stacked structure of the capping layer and the absorber layer is on an upper surface of the edge region of the substrate, and a sidewall of the stacked structure of the capping layer and the absorber layer is perpendicular to an upper surface of the substrate.

20 Claims, 20 Drawing Sheets

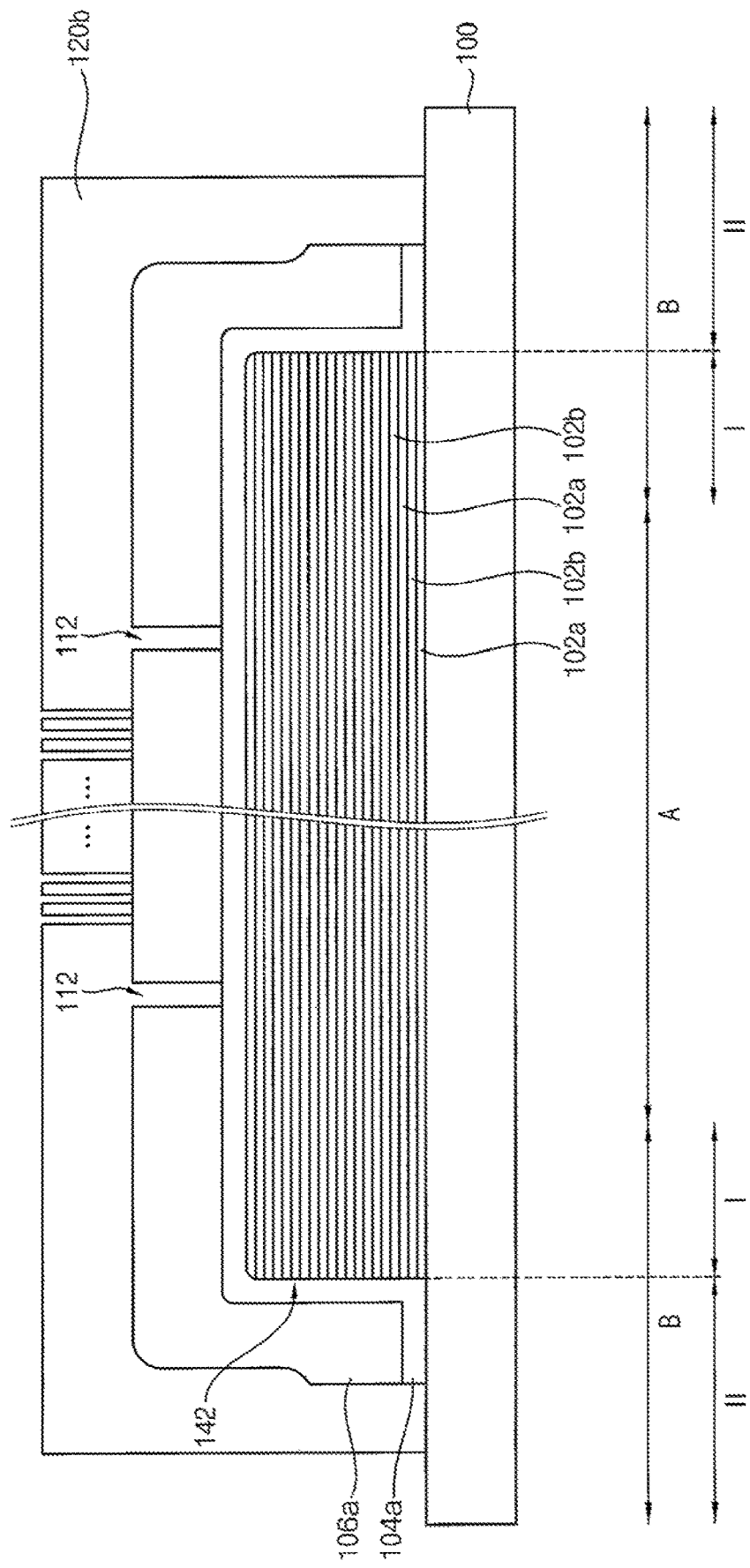

RETICLE IN AN APPARATUS FOR EXTREME ULTRAVIOLET EXPOSURE

CROSS-REFERENCE TO RELATED APPLICATION

Korean Patent Application No. 10-2020-0037307, filed on Mar. 27, 2020, in the Korean Intellectual Property Office, and entitled: "Reticle in an Apparatus for Extreme Ultraviolet Exposure," is incorporated by reference herein in its entirety.

BACKGROUND

1. Field

Embodiments relate to a reticle in an apparatus for extreme ultraviolet (EUV) exposure.

2. Description of the Related Art

An exposure process may use an apparatus for EUV exposure.

SUMMARY

The embodiments may be realized by providing a reticle for an apparatus for EUV exposure, the reticle including a substrate including an edge region and a main region; a multi-layer structure on the main region and a portion of the edge region of the substrate, a sidewall of the multi-layer structure overlying the edge region of the substrate; a capping layer covering an upper surface and the sidewall of the multi-layer structure and at least a portion of the edge region of the substrate; and an absorber layer on the capping layer, the absorber layer covering an entire upper surface of the capping layer on the edge region of the substrate, wherein a stacked structure of the capping layer and the absorber layer is on an upper surface of the edge region of the substrate, and a sidewall of the stacked structure of the capping layer and the absorber layer is perpendicular to an upper surface of the substrate.

The embodiments may be realized by providing a reticle for an apparatus for EUV exposure, the reticle including a substrate including an edge region and a main region; a multi-layer structure on the main region and a portion of the edge region of the substrate, a sidewall of the multi-layer structure overlying the edge region of the substrate; a capping layer covering an upper surface and the sidewall of the multi-layer structure and at least a portion of the edge region of the substrate; and an absorber layer on the capping layer, the absorber layer covering an entire upper surface of the capping layer on the upper surface of the multi-layer structure, the sidewall of the multi-layer structure, and the edge region of the substrate, wherein a shortest distance from an end of the multi-layer structure to an end of the substrate is 1.8 mm to 2.0 mm.

The embodiments may be realized by providing a reticle for an apparatus for EUV exposure, the reticle including a substrate; a multi-layer structure on the substrate; a capping layer covering an upper surface and a sidewall of the multi-layer structure and an upper surface of an edge region of the substrate; and an absorber layer on the capping layer, wherein the absorber layer covers an entire upper surface of the capping layer on the sidewall of the multi-layer structure and the edge region of the substrate.

The embodiments may be realized by providing a method of manufacturing a reticle for an apparatus for EUV exposure, the method including forming a multi-layer structure on a main region and a portion of an edge region of substrate such that a sidewall of the multi-layer structure is on the edge region of the substrate; forming a preliminary capping layer covering an upper surface and a sidewall of the multi-layer structure and a portion of an upper surface of the edge region of the substrate; forming a preliminary absorber layer on the preliminary capping layer such that the preliminary absorber layer covers an entire upper surface of the preliminary capping layer on the edge region of the substrate; and etching edge portions of the preliminary capping layer and the preliminary absorber layer on the upper surface of the edge region of the substrate to form a stacked structure of a capping layer and an absorber layer, wherein the stacked structure covers the upper surface and the sidewall of the multi-layer structure and a portion of an upper surface of the edge region of the substrate, and a sidewall of the stacked structure of the capping layer and the absorber layer is perpendicular to an upper surface of the substrate.

BRIEF DESCRIPTION OF THE DRAWINGS

Features will be apparent to those of skill in the art by describing in detail exemplary embodiments with reference to the attached drawings in which:

FIGS. 16 to 21 are cross-sectional views of stages in a method of manufacturing a reticle in accordance with example embodiments.

DETAILED DESCRIPTION

Figure 1:
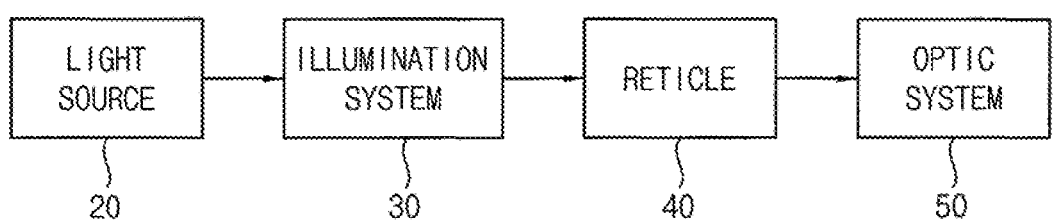
FIG. 1 is a block diagram of an apparatus for EUV exposure.
Figure 2:
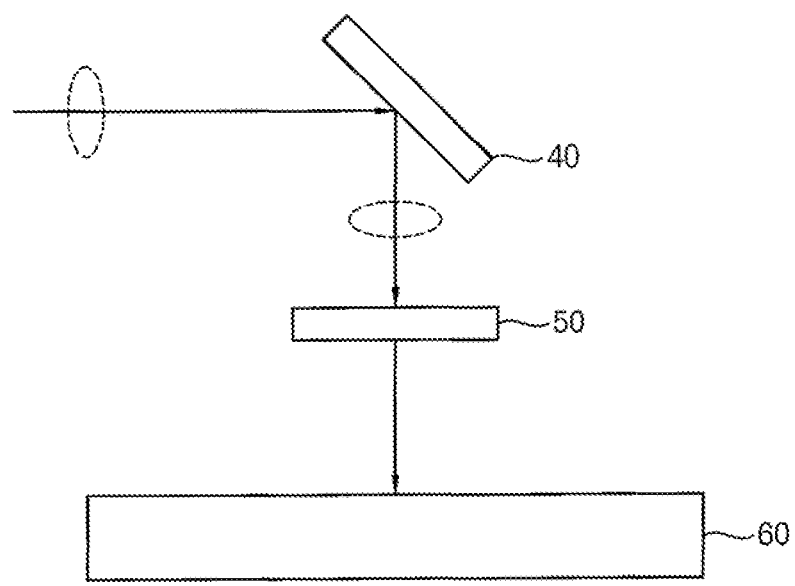
FIG. 2 shows an exposure of a target in an apparatus for EUV exposure.

FIG. 1 is a block diagram of an apparatus for EUV exposure. FIG. 2 shows an exposure of a target in an apparatus for EUV exposure.

Referring to FIGS. 1 and 2, the apparatus for EUV exposure 10 may include a light source 20, an illumination system 30, a reticle 40, and an optic system 50. The apparatus for EUV exposure 10 may be designed so as to irradiate EUV light onto a photoresist layer on a target substrate 60.

The light source 20 may generate EUV light having a wavelength between about 1 nm and about 100 nm. In an implementation, the light source 20 may generate EUV light having a wavelength of about 13.5 nm. The EUV light may be generated by a plasma source, a laser induction source, an electric discharge gas plasma source, or the like.

The illumination system 30 may include optical members guiding the EUV light to the reticle 40. In an implementation, the illumination system 30 may include a mirror system, lenses, or the like.

The reticle 40 may form patterned light for illuminating onto the photoresist layer on the target substrate 60. The reticle 40 may be loaded on an electrostatic chuck, and thus the reticle 40 may be fixed on the electrostatic chuck.

The optic system 50 may guide a light reflected from the reticle 40 onto the target substrate 60.

Hereinafter, the reticle 40 included in the apparatus for EUV exposure is mainly described. The reticle 40 may be used in the same term as an exposure mask or a photo mask. Further, cross-sectional views described below mainly show an edge portion of a substrate in the reticle.

Figure 3:
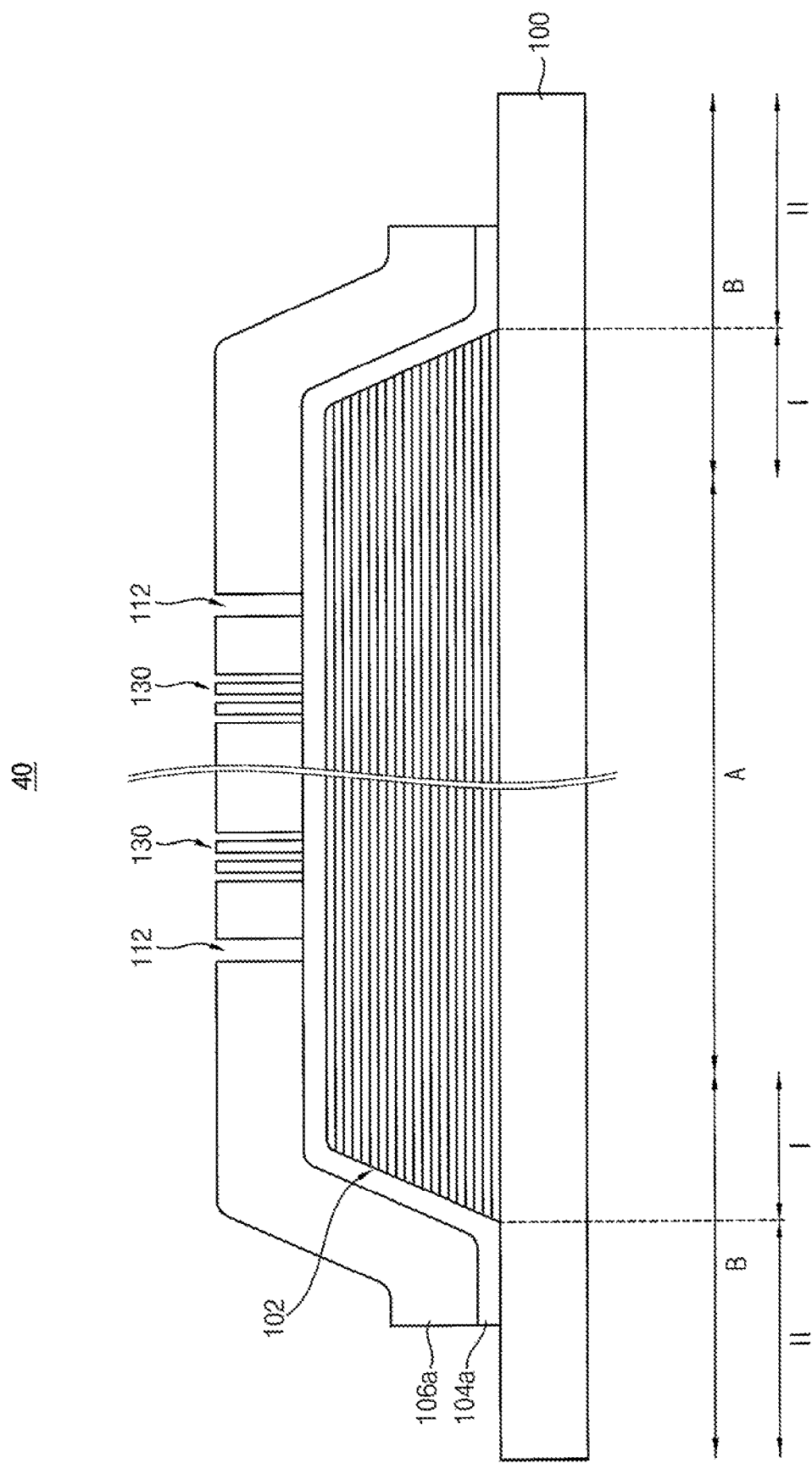
FIG. 3 is a cross-sectional view of a reticle in accordance with example embodiments.
Figure 4:
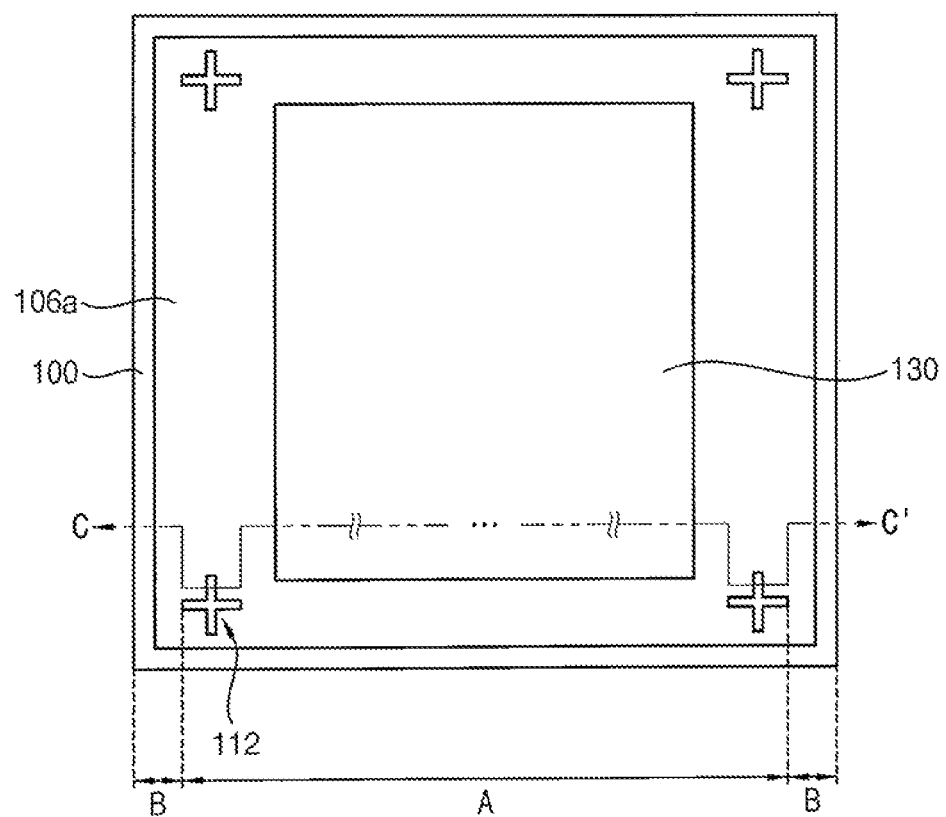
FIG. 4 is a plan view of a reticle in accordance with example embodiments.

FIG. 3 is a cross-sectional view of a reticle in accordance with example embodiments. FIG. 4 is a plan view of a reticle in accordance with example embodiments.

FIG. 3 is a cross-sectional view taken along line C-C' in FIG. 4. FIG. 3 mainly shows an edge portion of a substrate.

Referring to FIGS. 3 and 4, the reticle 40 may include a substrate 100.

The substrate 100 may include a low thermal expansion material such as doped silicon oxide or quartz, silicon, silicon carbide, and black diamond. In an implementation, the substrate 100 may include $SiO_2$ doped with $TiO_2$.

An upper surface of the substrate 100 may include a main region A (in or on which main patterns for forming circuit patterns may be formed) and an edge region B (in or on which the main patterns may not be formed). The edge region B may be at an edge portion of the substrate 100 and may surround the main region A.

The edge region B may include a first region I and a second region II. The first region I may be adjacent to the main region A, and may include an end portion of a multi-layer structure 102 (e.g., the end of the multi-layer structure 102 may overlie or be on the first region I of the edge region B). The second region II may include an end of the substrate 100, and may not include the multi-layer structure 102 (e.g., the multi-layer structure 102 may not extend onto or overlie the second region II). In an implementation, the second region II may be a region from or between the end of the multi-layer structure 102 to the end of the substrate 100.

In order to pattern a mask using an electron beam, an edge portion of the multi-layer structure 102 may be electrically grounded. The end of the multi-layer structure 102 may be adjacent to the edge portion of the substrate 100. In an implementation, a distance or width of the second region II, e.g., a shortest distance from the end of the multi-layer structure 102 to the end of the substrate 100, may be 2.0 mm or less. In an implementation, the width of the second region II may be 1.8 mm to 2.0 mm.

The multi-layer structure 102 may be on the main region A and the first region I of the substrate 100. The multi-layer structure 102 may be a reflective layer for reflecting EUV light. In the multi-layer structure 102, a plurality of layers 102a and 102b may be alternately stacked. In an implementation, the multi-layer structure 102 may include a structure in which sets of molybdenum layer/silicon layer (Mo/Si) are repeatedly stacked or a structure in which sets of molybdenum layer/beryllium layer (Mo/Be) are repeatedly stacked.

In the multi-layer structure 102, a plurality of layers having different refractive indexes may be alternately and repeatedly stacked to have a predetermined thickness. Thus, the EUV light may be reflected from the multi-layer structure 102 by a constructive interference due to phase matching and/or a sum of intensity. In an implementation, a thickness of each of layers may be 2 nm to 7 nm. In the multi-layer structure 102, the number of sets of alternately stacked layers may be about 20 to 100. A total thickness of the multi-layer structure 102 may be 200 nm to 400 nm. In an implementation, a total thickness of the multi-layer structure 102 may be 250 nm to 300 nm.

In an implementation, the multi-layer structure 102 may be on an entire upper surface of the main region A of the substrate 100. The end of the multi-layer structure 102 may be on the first region I. A sidewall of the multi-layer structure 102 may be on or overlie the first region I.

A length or dimension (in a horizontal direction) of the multi-layer structure 102 may be gradually increased from a top portion to the bottom portion thereof (e.g., from a portion distal to the substrate 100 to a portion proximate to the substrate 100). In an implementation, an angle between or formed by the sidewall of the multi-layer structure 102 and the upper surface of the substrate 100 (e.g., outside the sidewall of the multi-layer structure 102) may be an obtuse angle. In an implementation, the multi-layer structure 102 may have an oblique sidewall slope or incline.

A capping layer 104a may be on an upper surface and a sidewall of the multi-layer structure 102 and on a portion of the second region II of the substrate 100. The capping layer 104a may help protect the multi-layer structure 102. In an implementation, the capping layer 104a may help prevent oxidation of the multi-layer structure 102.

In an implementation, the capping layer 104a may include ruthenium (Ru). In an implementation, the capping layer 104a may include a material including ruthenium and silicon. In an implementation, a thickness of the capping layer 104a may be 1 nm to 10 nm. In an implementation, the thickness of the capping layer 104a may be 3 nm to 4 nm.

The capping layer 104a may cover the upper surface of the multi-layer structure 102 and the sidewalls of the multi-layer structure 102. In an implementation, the capping layer 104a may extend onto the second region II of the substrate 100. Therefore, the multi-layer structure 102 may be sufficiently protected by the capping layer 104a.

An absorber layer 106a may be on the capping layer 104a.

The absorber layer 106a on the main region A of the substrate 100 may have a patterned shape. The patterned absorber layer may serve as a main pattern 130 for forming a circuit pattern. In addition, a portion of the patterned absorber layer may serve as an alignment key pattern 112 for aligning of the substrate 100. The alignment key patterns 112 may be on an edge portion of the main region A.

The absorber layer 106a on the edge region B of the substrate 100 may completely cover an upper surface of the capping layer 104a. In an implementation, the capping layer 104a and the absorber layer 106a may be stacked on the upper surface and the sidewall of the multi-layer structure 102 and on the portion of the second region II of the substrate 100. In an implementation, the absorber layer 106a on the edge region B of the substrate 100 may help protect the capping layer 104a.

The absorber layer 106a may absorb the EUV light. The absorber layer 106a may include a single layer or multi-layers. In an implementation, the absorber layer 106a may include tantalum (e.g., non-compounded tantalum) or a tantalum compound. In an implementation, the absorber layer 106a may include TaN or TaBN. In an implementation, the absorber layer 106a may include molybdenum, palladium, zirconium, nickel silicide, titanium, titanium nitride, chromium, chromium oxide, aluminum oxide, aluminum-copper alloy, or the like. In an implementation, a thickness of the absorber layer 106a may be 40 nm to 80 nm. In an implementation, the thickness of the absorber layer 106a may be 50 nm to 60 nm. In an implementation, the thickness of the absorber layer 106a may be greater than the thickness of the capping layer 104a. As used herein, the term "or" is not an exclusive term, e.g., "A or B" would include A, B, or A and B.

As described above, a stacked structure of the capping layer 104a and the absorber layer 106a may cover the upper surface of the multi-layer structure 102 as well as the sidewall of the multi-layer structure 102. Further, the stacked structure may extend to the second region II of the substrate 100. That is, an end portion of the stacked structure of the capping layer 104a and the absorber layer 106a may be disposed in the region from the end portion of the multi-layer structure 102 to the end portion of the substrate 100.

A sidewall of the stacked structure of the capping layer 104a and the absorber layer 106a may have a vertical slope from or relative to the upper surface of the substrate 100 (e.g., the sidewall of the stacked structure of the capping layer 104a and the absorber layer 106a may be perpendicular to the upper surface of the substrate 100). In an implementation, the stacked structure of the capping layer 104a and the absorber layer 106a may be at an outermost side of the substrate 100. The stacked structure on the outermost side of the substrate 100 may have a vertical sidewall from or relative to the upper surface of the substrate 100. In an implementation, the sidewall of the stacked structure of the capping layer 104a and the absorber layer 106a may include outermost surfaces that are coplanar with each other.

In a plan view, the sidewall of the stacked structure of the capping layer 104a and the absorber layer 106a may have a uniform roughness, e.g., without a laterally protruding portion. Hereinafter, a roughness refers to a roughness of a sidewall (e.g., an edge profile) in the plan view. In the plan view, an edge portion of the stacked structure of the capping layer 104a and the absorber layer 106a may have one boundary (e.g., may be flat), and may not include a protruding portion.

The reticle 40 may be loaded on an electrostatic chuck, and a strong electric field may be applied between the electrostatic chuck and the reticle 40. Thus, the reticle 40 may be fixed on the electrostatic chuck. The capping layer 104a may have conductivity.

If a portion of the sidewall of the capping layer 104a were to protrude, or the sidewall roughness of the capping layer 104a were not good, the strong electric fields could be concentrated at the protruding portion of the sidewall of the capping layer 104a. Thus, electrical arcing could occur at the protruding portion of the capping layer 104a, and a defect of the reticle 40 could occur. However, in the reticle 40 in accordance with example embodiments, the sidewall of the capping layer 104a may have no protruding portion (e.g., may be flat), and the sidewall roughness of the capping layer 104a may be good. Thus, the electrical arcing may not be generated at the reticle 40.

After performing one or several exposure processes, a cleaning process for removing particles on the reticle 40 may be performed. During the cleaning process of the reticle 40, the capping layer 104a may be partially removed or lift-off may occur. For example, the capping layer 104a on the edge portion of the multi-layer structure 102 could be easily removed or lift-off could occur, due to the cleaning process.

In the reticle 40 in accordance with example embodiments, the upper surface of the capping layer 104a on the edge region B may be completely covered by the absorber layer 106a. Therefore, during the cleaning process of the reticle 40, the capping layer 104a on the edge region B may be protected by the absorber layer 106a having the thickness greater than the thickness of the capping layer 104a, and thus the capping layer 104a may not be partially removed or lift-off may not occur. The reticle 40 may have excellent durability.

FIGS. 5 to 14 are cross-sectional views of stages in a method of manufacturing a reticle in accordance with example embodiments.

Each of the cross-sectional views shows a part of the reticle.

Figure 5:
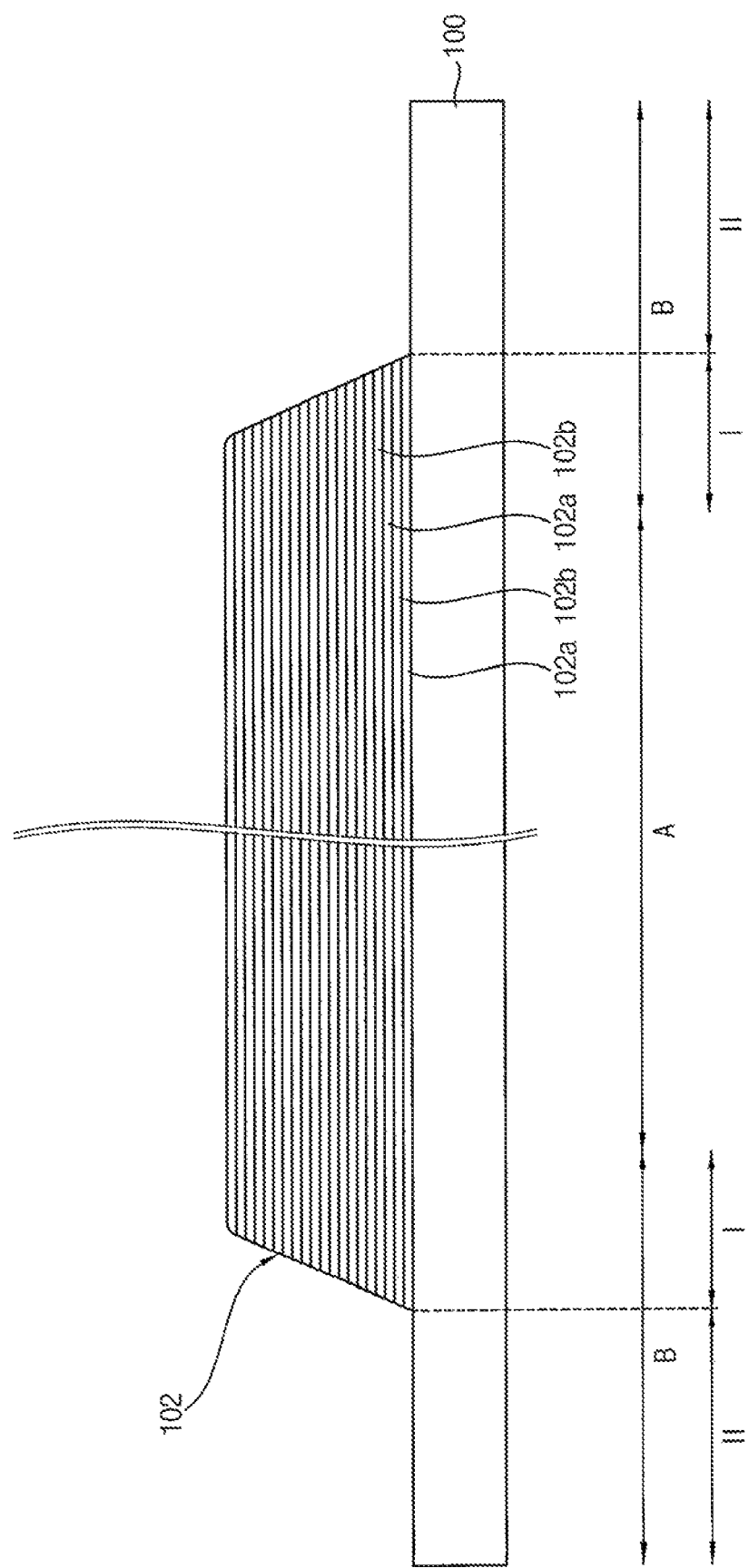
FIGS. 5 to 14 are cross-sectional views of stages in a method of manufacturing a reticle in accordance with example embodiments.

Referring to FIG. 5, a substrate 100 may include a main region A and an edge region B. The edge region B may include a first region I adjacent to the main region A and a second region II including an end or outer edge of the substrate 100.

A multi-layer structure 102 may be formed on the main region A and the first region I of the substrate 100. In an implementation, the multi-layer structure 102 may be formed so that a shortest distance from an end of the multi-layer structure 102 to the end of the substrate 100 may be 2.0 mm or less. In an implementation, the multi-layer structure 102 may be formed so that the shortest distance from the end of the multi-layer structure 102 to the end of the substrate may be 1.8 mm to 2.0 mm.

In an implementation, the multi-layer structure 102 may be formed by alternately depositing molybdenum/silicon (Mo/Si). In an implementation, the multi-layer structure 102 may be formed by alternately depositing molybdenum/beryllium (Mo/Be).

In an implementation, the layers included in the multi-layer structure 102 may be formed by a physical vapor deposition, a chemical vapor deposition, an atomic layer deposition, or the like.

When the multi-layer structure 102 is formed on the main region A and the first region I of the substrate 100, an end of each of the layers included in the multi-layer structure 102 may have a thickness less than a thickness of other portion thereof. Further, a length in the horizontal direction of the multi-layer structure 102 may be gradually increased from a top portion to the bottom portion thereof. In an implementation, an angle between or formed by a sidewall of the multi-layer structure 102 and an upper surface of the substrate 100 outside the sidewall of the multi-layer structure 102 may be an obtuse angle. In an implementation, the multi-layer structure 102 may have an oblique sidewall slope.

Figure 6:
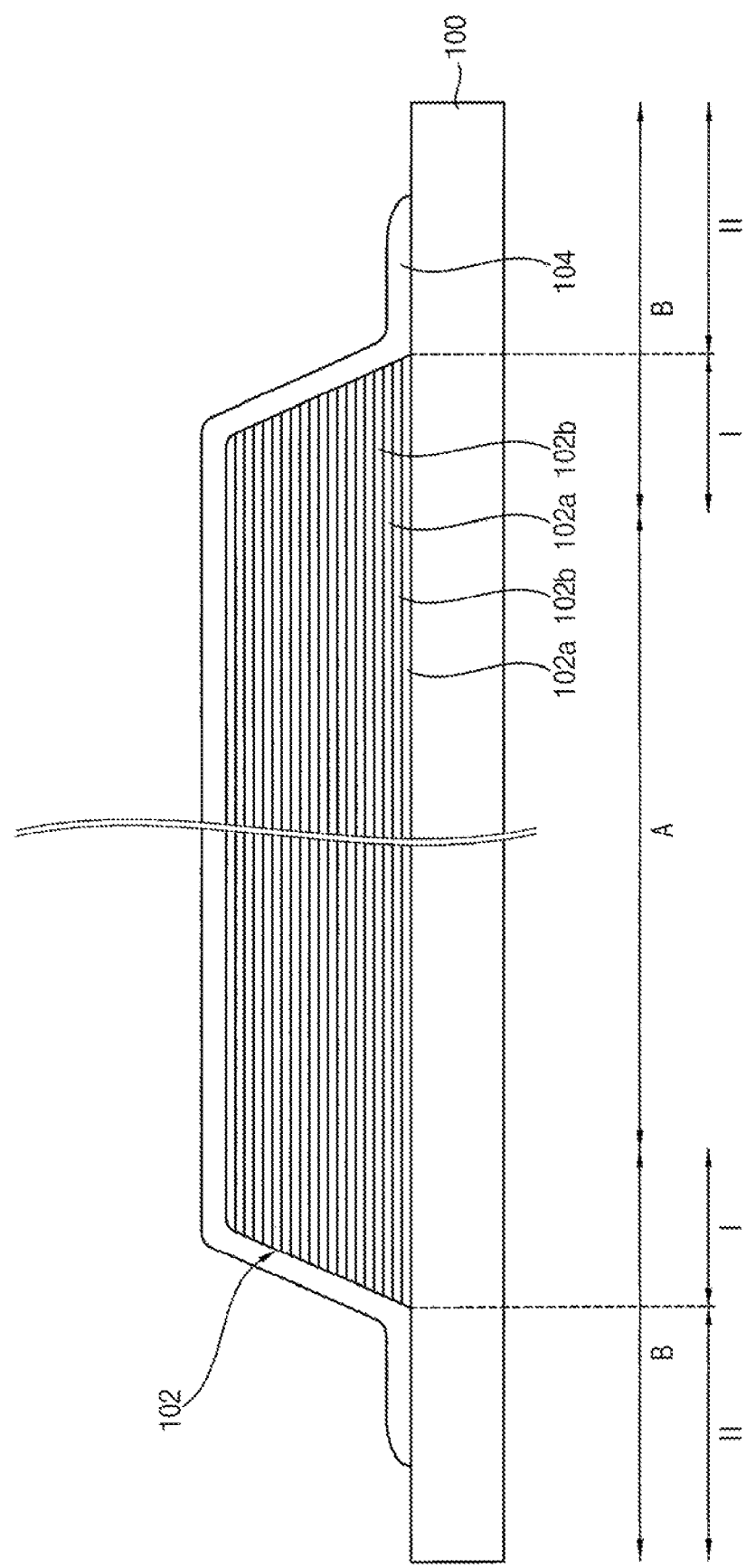

Referring to FIG. 6, a preliminary capping layer 104 may be formed to cover a surface of the multi-layer structure 102 and at least a portion of the second region II of the substrate 100.

In an implementation, the preliminary capping layer 104 may be formed by a physical vapor deposition, a chemical vapor deposition, an atomic layer deposition, or the like.

In an implementation, the preliminary capping layer 104 may be formed to have a thickness of 1 nm to 10 nm. In an implementation, the preliminary capping layer 104 may be formed to have a thickness of 3 nm to 4 nm.

An end of the preliminary capping layer 104 may have a thickness slightly less than a thickness of other portion of the preliminary capping layer 104.

Figure 7:
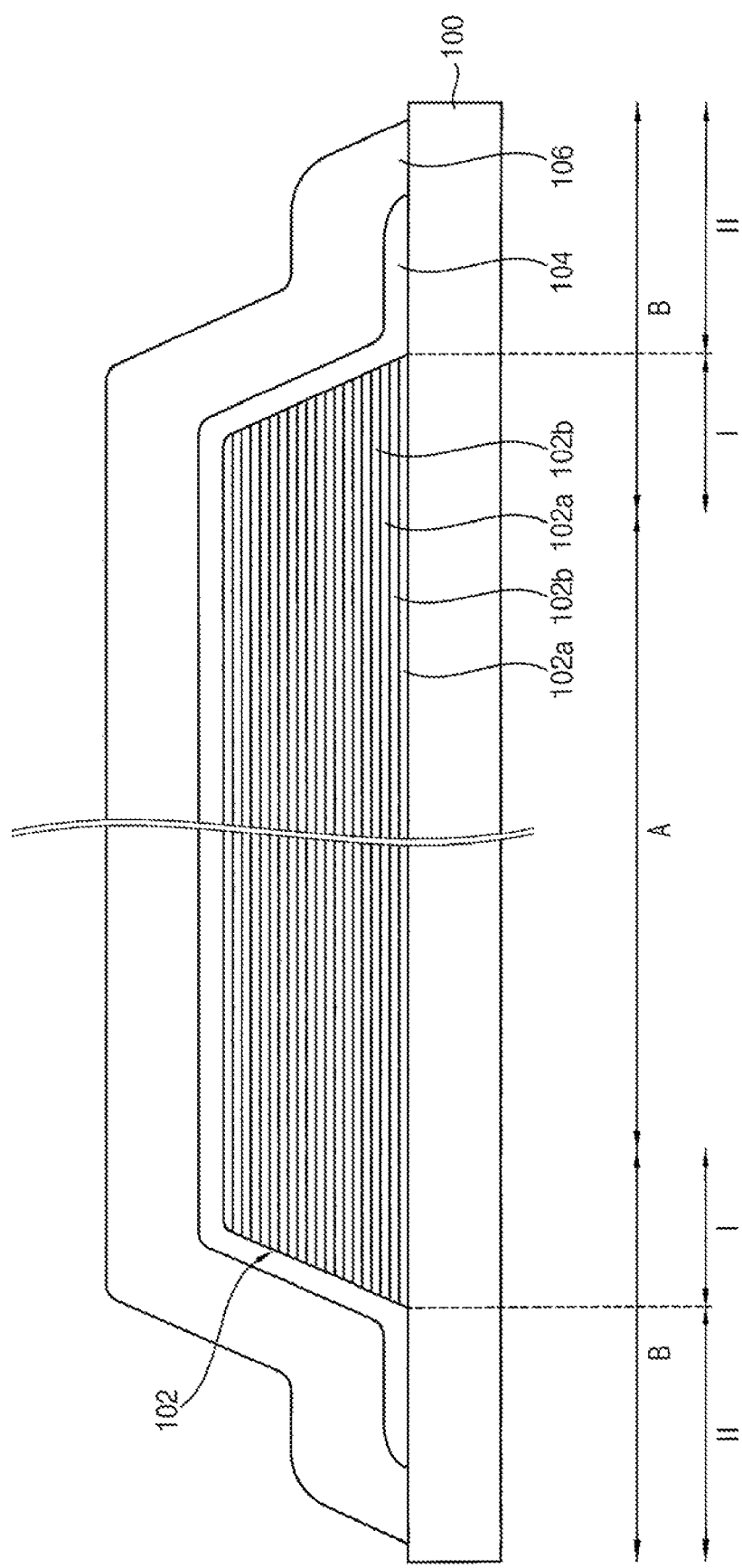

Referring to FIG. 7, a preliminary absorber layer 106 may be formed to cover the preliminary capping layer 104 and at least a portion of an exposed surface of second region II of the substrate 100.

In an implementation, the preliminary absorber layer 106 may be formed by a physical vapor deposition, a chemical vapor deposition, an atomic layer deposition, or the like.

In an implementation, the preliminary absorber layer 106 may be formed to have a thickness of 40 nm to 80 nm. In an implementation, the preliminary absorber layer 106 may be formed to have a thickness of 50 nm to 60 nm. In an implementation, the thickness of the preliminary absorber layer 106 may be greater than the thickness of the preliminary capping layer 104.

An end of the preliminary absorber layer 106 may have a thickness slightly less than a thickness of other portion of the preliminary absorber layer 106.

The preliminary capping layer 104 and the preliminary absorber layer 106 may be stacked on the second region II of the substrate 100.

Figure 8:
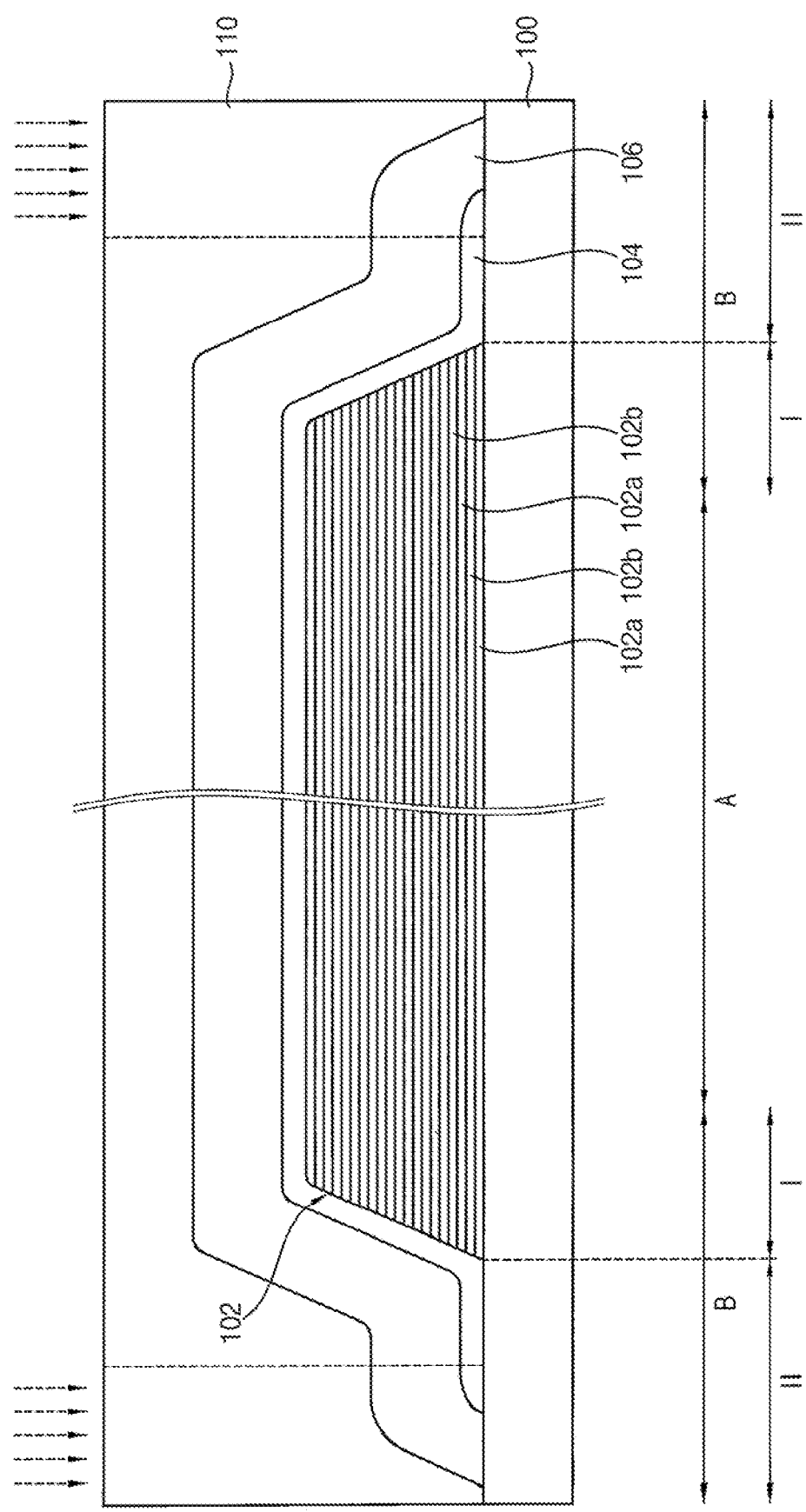
Figure 9:
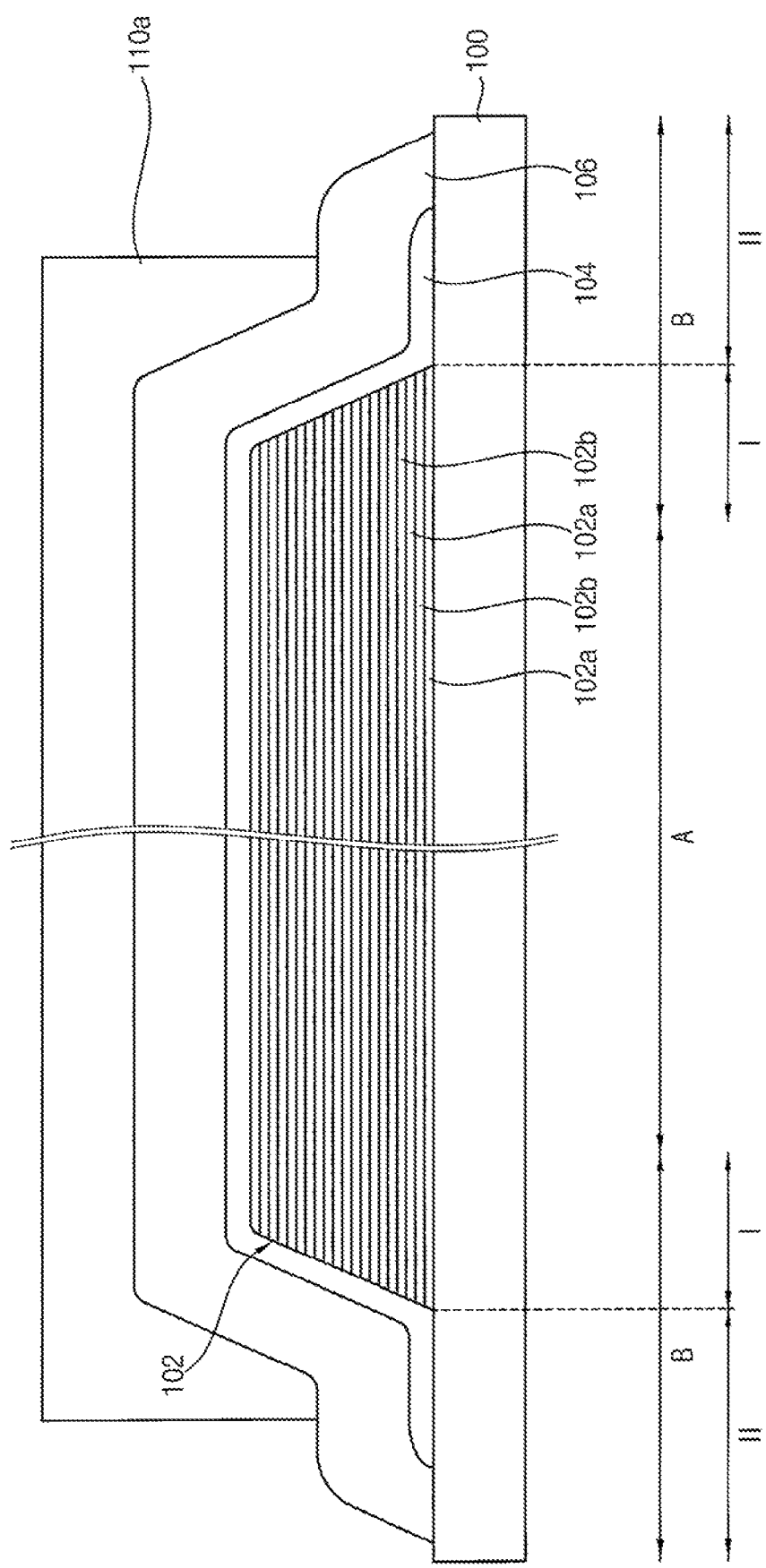

Referring to FIGS. 8 and 9, a preliminary first photoresist layer 110 may be coated to cover the preliminary absorber layer 106 and the substrate 100. Thereafter, a first edge bead removal (EBR) process, in which an edge portion of a predetermined width of the preliminary first photoresist layer 110 is removed, may be performed, so that an edge bead of the preliminary first photoresist layer 110 may be removed. Thus, a first photoresist layer 110a may be formed by the first EBR process.

An end of the first photoresist layer 110a may be in a region from or between an end of the multi-layer structure 102 to an end of the substrate 100. The end of the first photoresist layer 110a may be on a stacked structure of the preliminary capping layers 104 and the preliminary absorber layers 106 on the second region II.

Therefore, the first photoresist layer 110a may be formed to cover the preliminary absorber layer 106 on the main region A, the first region I, and a portion of the second region II. An edge portion of the preliminary absorber layer 106 on the other portion of the second region II may be exposed (e.g., not covered by the first photoresist layer 110a). The exposed preliminary absorber layer 106 may include an end portion of the preliminary absorber layer 106 having relatively thin thickness.

In an implementation, the first EBR process may be performed by an optical EBR process. The optical EBR process may include an exposure process, a post-exposure bake process, and a development process of the edge portion of the preliminary first photoresist layer 110, and the edge portion of the preliminary first photoresist layer 110 may be removed. In the optical EBR process, a light source used in the exposure process may include, e.g., a laser beam, an electron beam (E-beam), an ion beam (ion-beam), or the like.

When the optical EBR process is performed, the edge portion of the preliminary first photoresist layer 110 may be accurately removed by the predetermined width or amount. Therefore, a roughness of the edge portion of the first photoresist layer may be uniform.

In the first EBR process for removing the edge portion of the preliminary first photoresist layer on the substrate 100, it may not be preferable to use a solvent. The solvent may not be uniformly applied to the edge portion of the preliminary first photoresist layer, and the edge portion of the predetermined width of the preliminary first photoresist layer may not be accurately removed by the solvent. An edge roughness of the first photoresist layer formed by performing the EBR process using a solvent may be worse (e.g., rougher) than an edge roughness of the first photoresist layer 110a formed by performing the optical EBR process.

Figure 10:
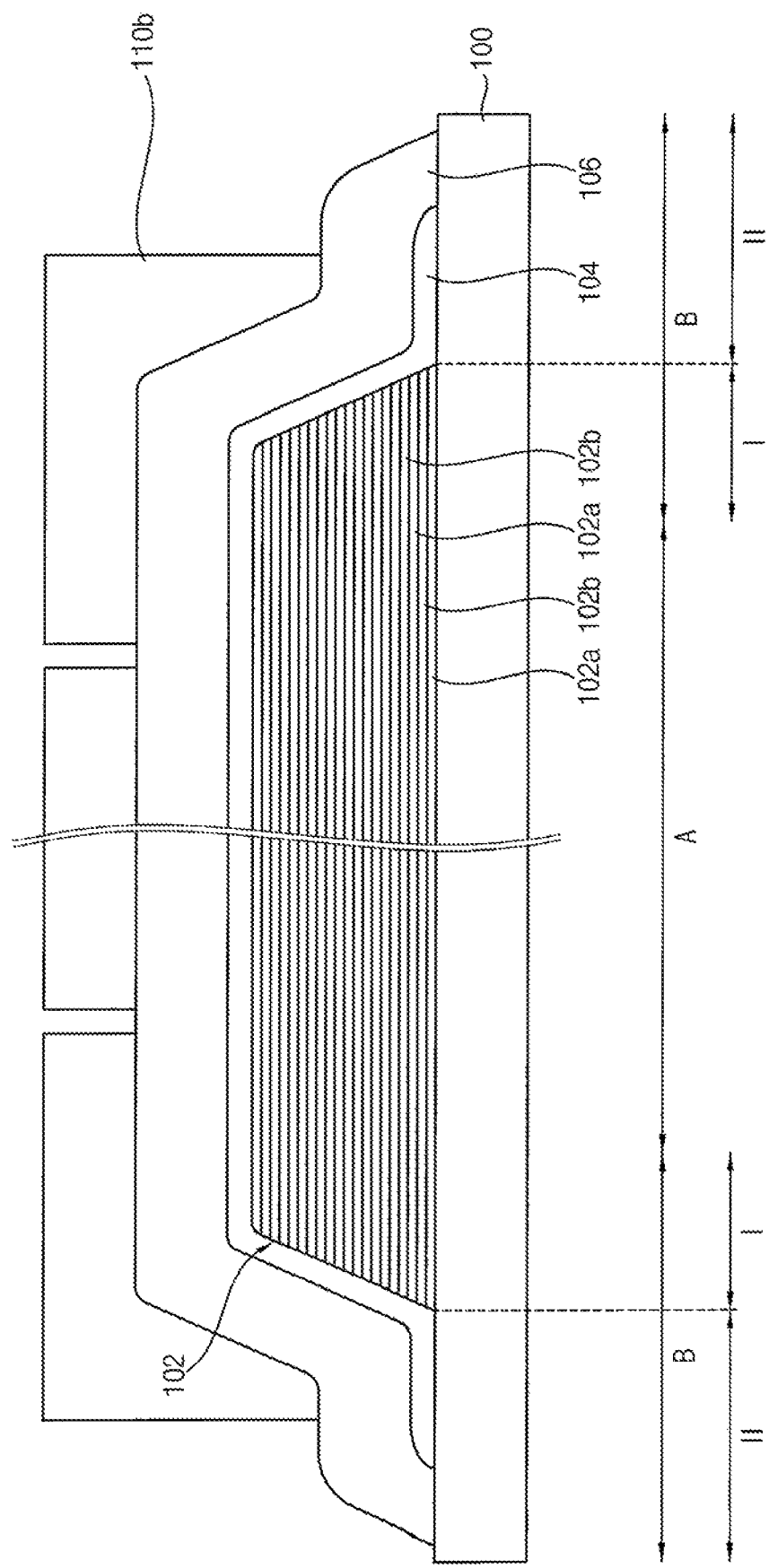

Referring to FIG. 10, a first photoresist pattern 110b may be formed by performing a photo process on the first photoresist layer 110a.

In an implementation, the first photoresist layer 110a on the edge portion of the main region A may be patterned by the photo process. The first photoresist pattern 110b may serve as an etching mask for forming alignment key patterns used to align of the substrate 100.

The first photoresist layer 110a on the edge region B may not be patterned by the photo process. Thus, the first photoresist pattern 110b may cover the preliminary absorber layer 106 on the first region I and a portion of the second region II. In addition, an edge portion of the preliminary absorber layer 106 on the other portion of the second region II of the substrate may be exposed by the first photoresist pattern 110b.

Figure 11:
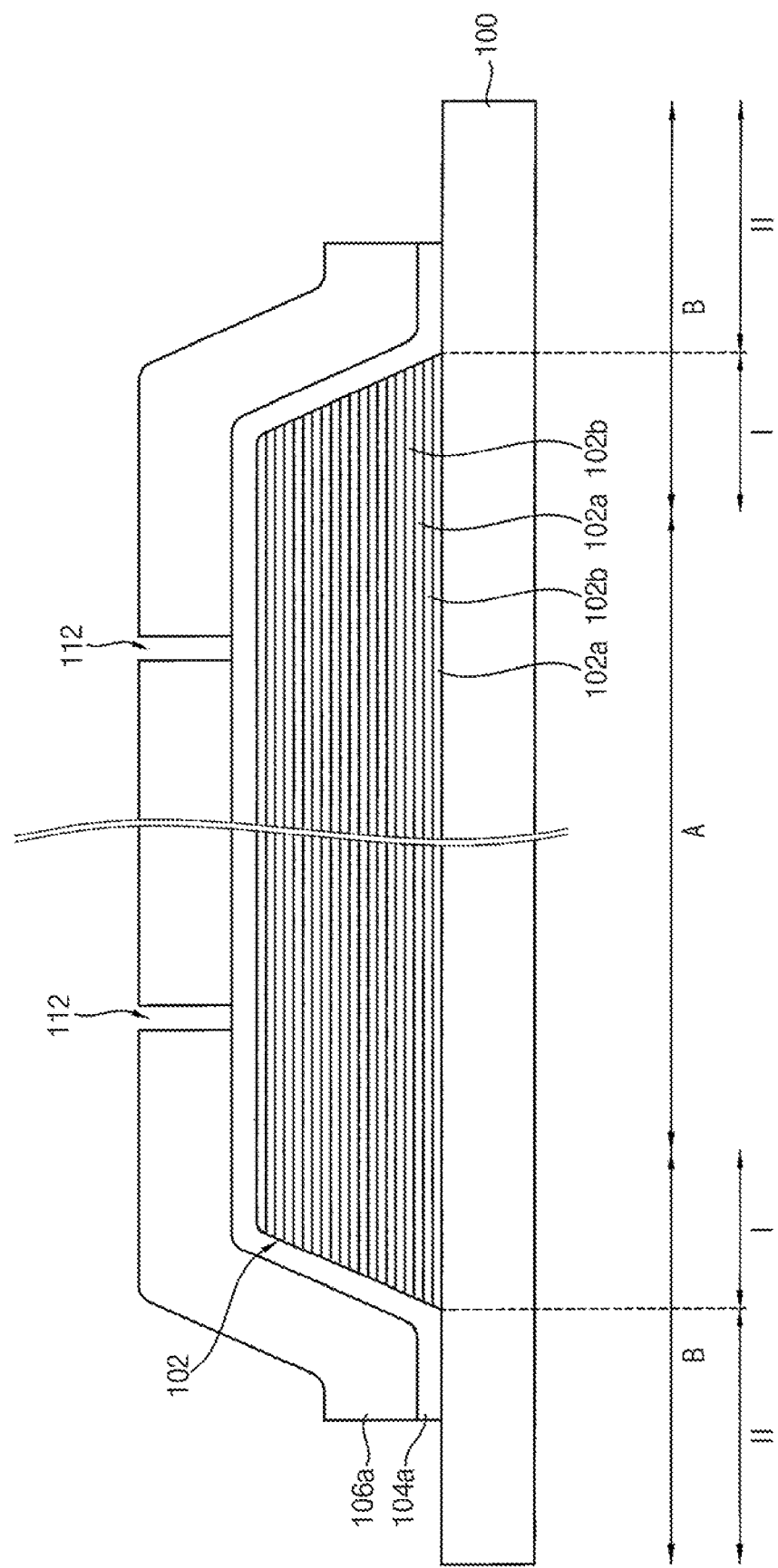

Referring to FIG. 11, the preliminary absorber layer 106 and the preliminary capping layer 104 on the second region and the preliminary absorber layer 106 on the main region may be etched using the first photoresist pattern 110b as an etching mask to form an absorber layer 106a and a capping layer 104a.

The preliminary absorber layer 106 on the main region A may be etched by the etching process, so that the alignment key patterns 112 used to align of the substrate 100 may be formed. The alignment key patterns 112 may be on an edge portion of the main region A.

Edge portions of the preliminary absorber layer 106 and the preliminary capping layer 104 may be etched by the etching process, so that the absorber layer 106a and the capping layer 104a may be formed. An end (e.g., a sidewall) of a stacked structure of the absorber layer 106a and the capping layer 104a may be on or overlie the second region II of the substrate 100. A thickness of the end of each of the preliminary absorber layer 106 and the preliminary capping layer 104 may be less than a thickness of each of the preliminary absorber layer 106 and the preliminary capping layer 104 on the main region A. When the preliminary absorber layer 106 on the main region A is etched by the etching process, the edge portions of the preliminary absorber layer 106 and the preliminary capping layer 104 may be completely etched (e.g., completely removed).

The etching process may include an anisotropic etching process. In an implementation, a sidewall of the stacked structure of the capping layer 104a and the absorber layer 106a may have a vertical slope from or relative to the upper surface of the substrate 100 (e.g., may be perpendicular to the upper surface of the substrate 100).

In an implementation, the edge portion of the first photoresist pattern 110b used as the etching mask in the etching process may have excellent roughness. An edge profile of the first photoresist pattern 110b may be transferred to the absorber layer 106a and the capping layer 104a. Therefore, the capping layer 104a may not have a laterally protruding portion, and a sidewall of the capping layer 104a may have excellent roughness.

The stacked structure of the capping layer 104a and the absorber layer 106a may cover the upper surface of the multi-layer structure 102 as well as the sidewall of the multi-layer structure 102. Further, the stacked structure may extend onto the second region II. In an implementation, the end of the stacked structure of the capping layer 104a and the absorber layer 106a may be on a region between (e.g., laterally between) the end of the multi-layer structure 102 and the end of the substrate 100.

Figure 12:
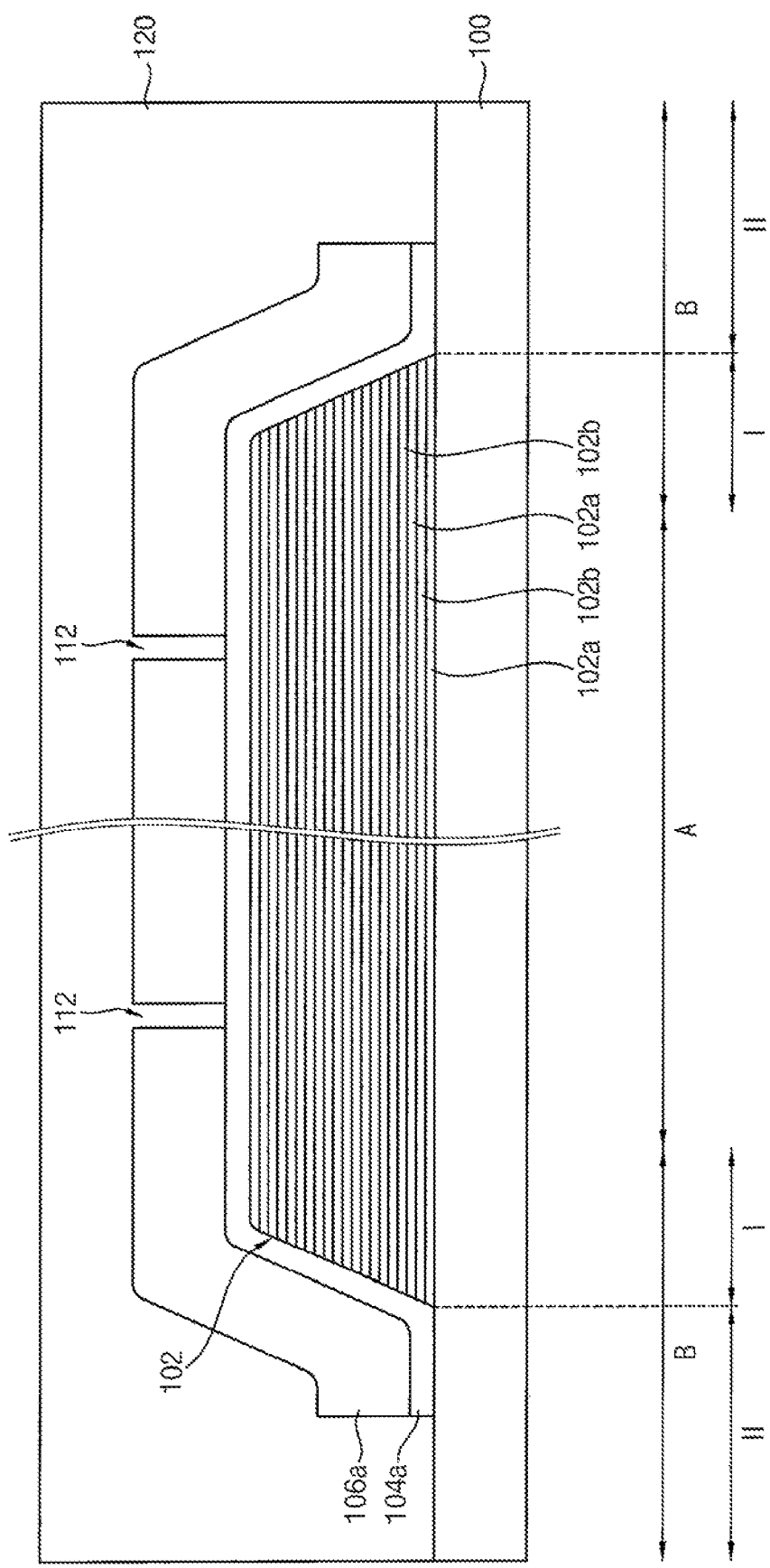
Figure 13:
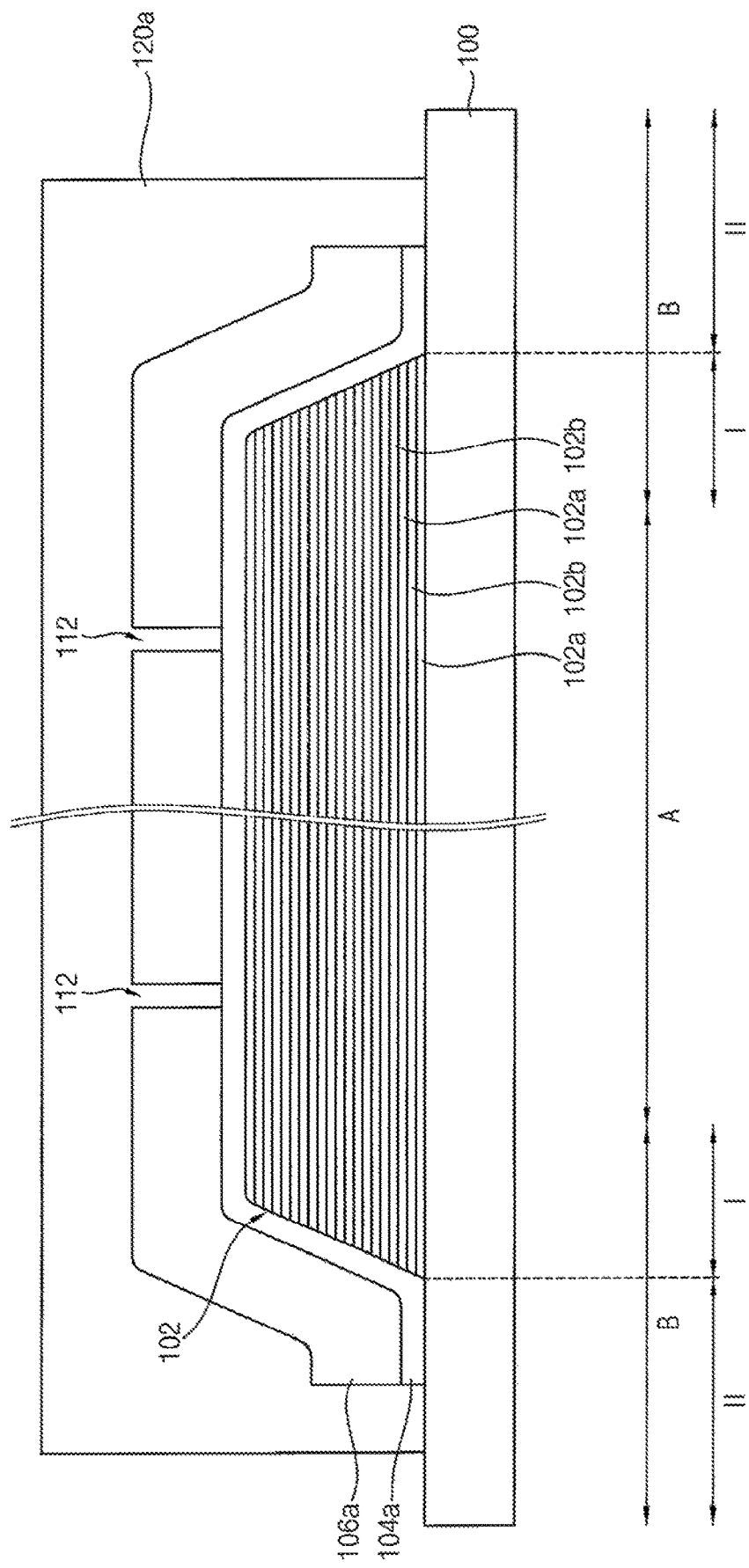

Referring to FIGS. 12 and 13, a preliminary second photoresist layer 120 may be coated to cover the absorber photoresist layer 106a and the substrate 100. Thereafter, a second EBR process may be performed on the preliminary second photoresist layer 120 to form a second photoresist layer 120a.

The second photoresist layer 120a may cover the stacked structure of the capping layer 104a and the absorber layer 106a. Therefore, an end of the second photoresist layer 120a may be on a region between the sidewall of the stacked structure of the capping layer 104a and the absorber layer 106a and the end of the substrate 100. The stacked structure of the capping layer 104a and the absorber layer 106a may not be exposed by (e.g., may be covered by) the second photoresist layer 120a.

The second photoresist layer 120a may be formed to cover an upper surface and a sidewall of the absorber layer 106a on the main region A, the first region I, and a portion of the second region II. An upper surface of the edge portion of the substrate 100 may be exposed by the second photoresist layer 120a.

In an implementation, the second EBR process may be an optical EBR process. The optical EBR process may be substantially the same as that illustrated with reference to FIGS. 8 and 9.

In the subsequent process, a layer on the substrate 100 may not be etched using an edge portion of the second photoresist layer 120a. Therefore, a roughness of the edge portion of the second photoresist layer 120a may not be important.

In an implementation, the second EBR process may be performed using a solvent. In an implementation, the solvent may be introduced along the edge portion of the substrate 100 to remove the edge portion of the preliminary second photoresist layer 120.

Figure 14:
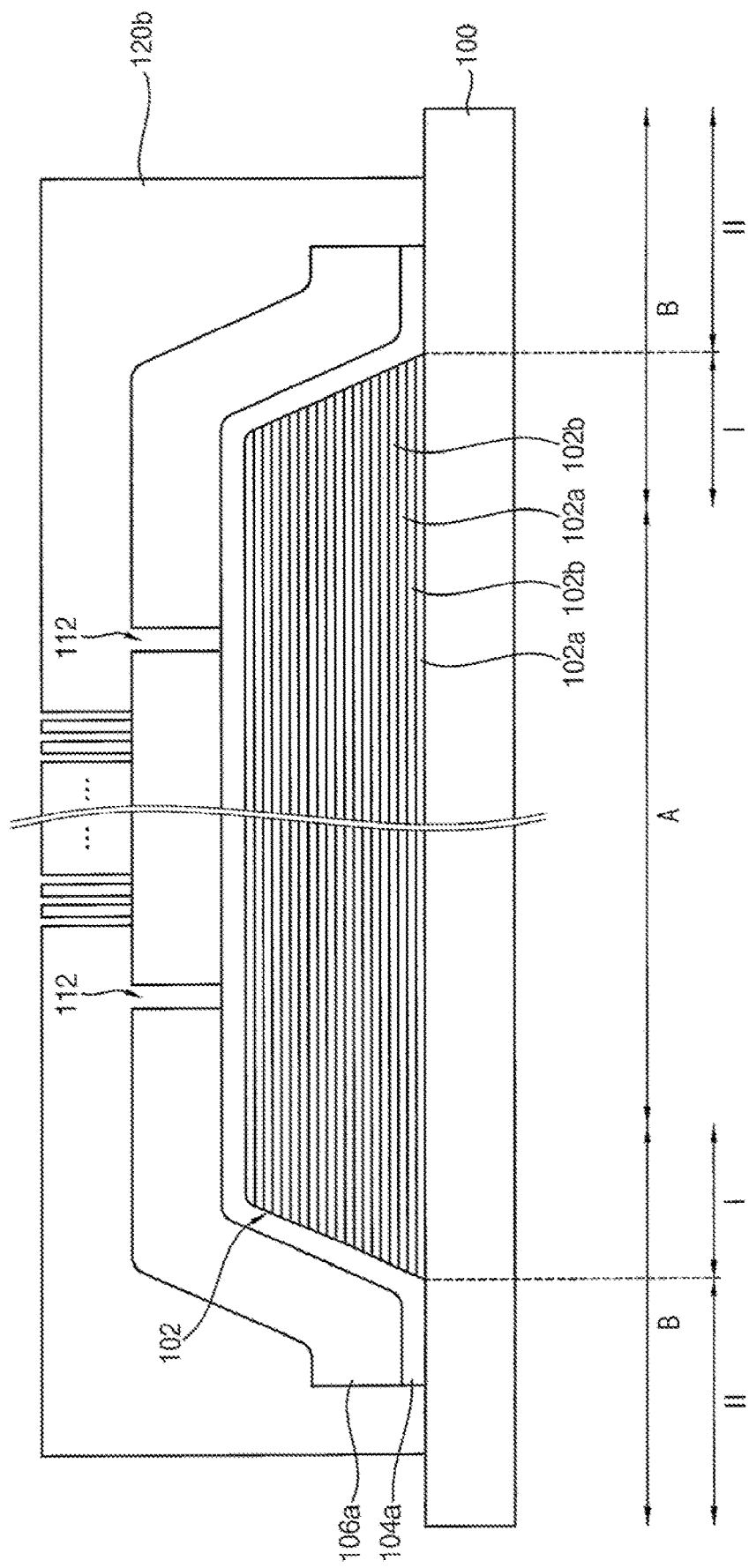

Referring to FIG. 14, a second photoresist pattern 120b may be formed by performing a photo (e.g., photolithography) process on the second photoresist layer 120a.

The second photoresist layer 120a on the absorber layer 106a on the main region A may be patterned by the photo process. The second photoresist pattern 120b may serve as an etching mask for patterning main patterns for forming the circuit pattern.

Referring to FIG. 3 again, the absorber layer 106a may be etched using the second photoresist pattern 120b as an etching mask to form the reticle 40.

In an implementation, the absorber layer 106a on the main region A may be patterned by the etching process, so that main patterns 130 for forming the circuit pattern may be formed on the main region A.

The capping layer 104a between the main patterns 130 may be exposed (e.g., through the main patterns 130). In an exposure process using EUV light, the EUV light may be reflected from the exposed capping layer 104a and the multi-layer structure 102 thereunder. Also, a photoresist layer on a target substrate for forming a semiconductor chip may be exposed by the reflected EUV light.

In the etching process, the stacked structure of the capping layer 104a and the absorber layer 106a on the edge region B of the substrate 100 may not be etched. Therefore, the sidewalls of the stacked structure of the capping layer 104a and the absorber layer 106a may have the vertical slope from or relative to the upper surface of the substrate 100.

The reticle 40 may include the stacked structure of the capping layer 104a and the absorber layer 106a on the edge region B of the substrate 100. The stacked structure of the capping layer 104a and the absorber layer 106a may cover the upper surface of the multi-layer structure 102 as well as the sidewall of the multi-layer structure 102, and the stacked structure may extend onto an upper surface of the second region II of the substrate 100.

In the reticle 40, the sidewall of the capping layer 104a may have good roughness without a laterally protruding portion. Thus, an electrical arcing may not occur at the reticle 40 due to the laterally protruding portion of the capping layer 104a. Further, the upper surface of the capping layer 104a on the edge region B may be completely covered by the absorber layer 106a, so that the reticle 40 may have excellent durability.

Figure 15:
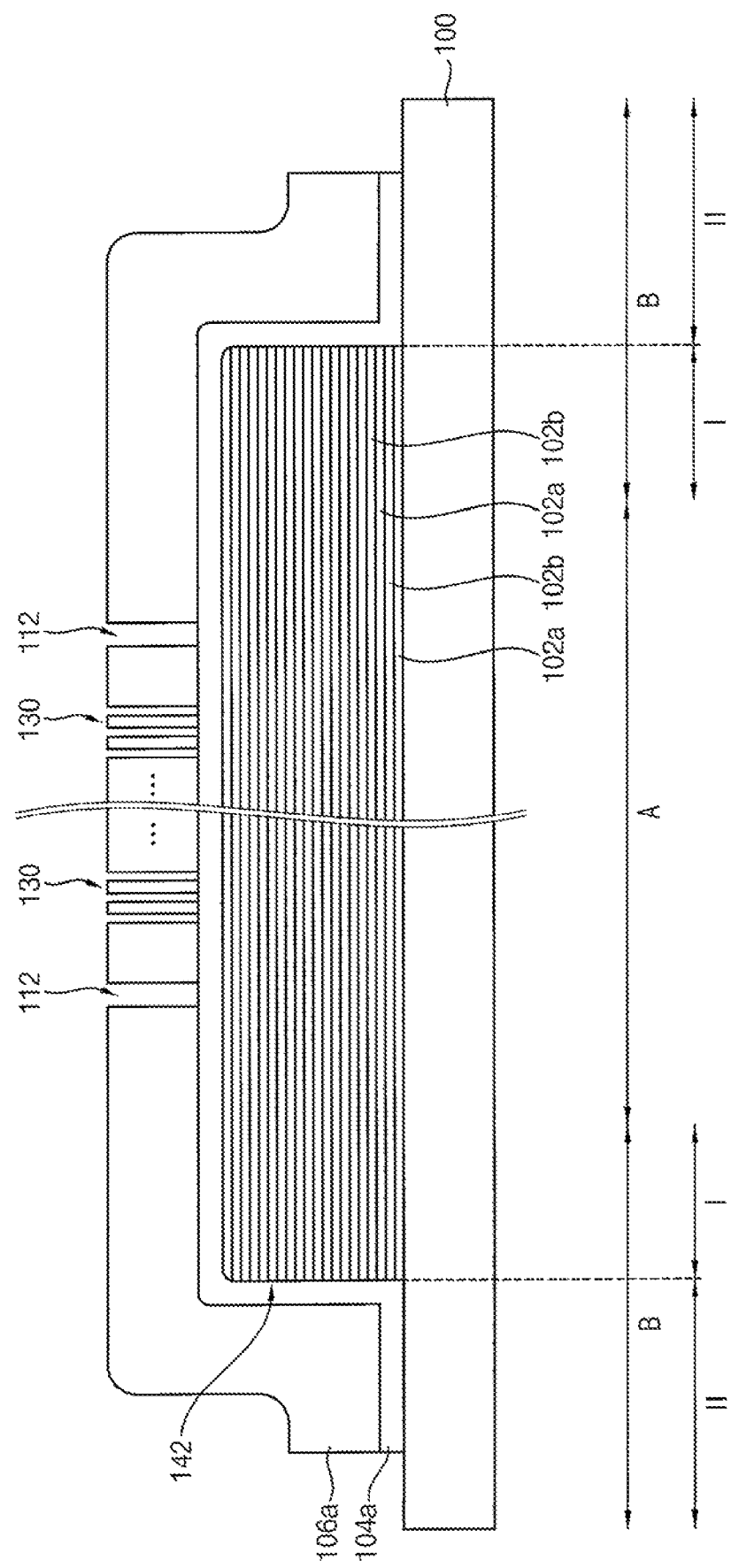
FIG. 15 is a cross-sectional view of a reticle in accordance with example embodiments.

FIG. 15 is a cross-sectional view of a reticle in accordance with example embodiments.

A reticle shown in FIG. 15 may be substantially the same as the reticle shown in FIG. 3, except for a shape of a sidewall of the multi-layer structure. Therefore, redundant or repeated descriptions may be omitted.

Referring to FIG. 15, a sidewall of the multi-layer structure 142 may be substantially perpendicular to an upper surface of the substrate 100.

In an implementation, the capping layer 104a and the absorber layer 106a may be formed on a vertical sidewall and an upper surface of the multi-layer structure 142 and a portion of the second region II of the substrate 100.

In an implementation, a shortest distance from an end of the multi-layer structure 142 to an end of the substrate 100 may be 2.0 mm or less. In an implementation, the shortest distance from the end of the multi-layer structure 142 to the end of the substrate 100 may be 1.8 mm to 2.0 mm.

A sidewall of the stacked structure of the capping layer 104a and the absorber layer 106a may have a vertical slope from or relative to the upper surface of the substrate 100. In an implementation, the stacked structure of the capping layer 104a and the absorber layer 106a may be at an outermost side of the substrate 100. The stacked structure on the outermost side of the substrate 100 may have a vertical slope from the upper surface of the substrate 100.

FIGS. 16 to 21 are cross-sectional views of stages in a method of manufacturing a reticle in accordance with example embodiments.

Figure 16:
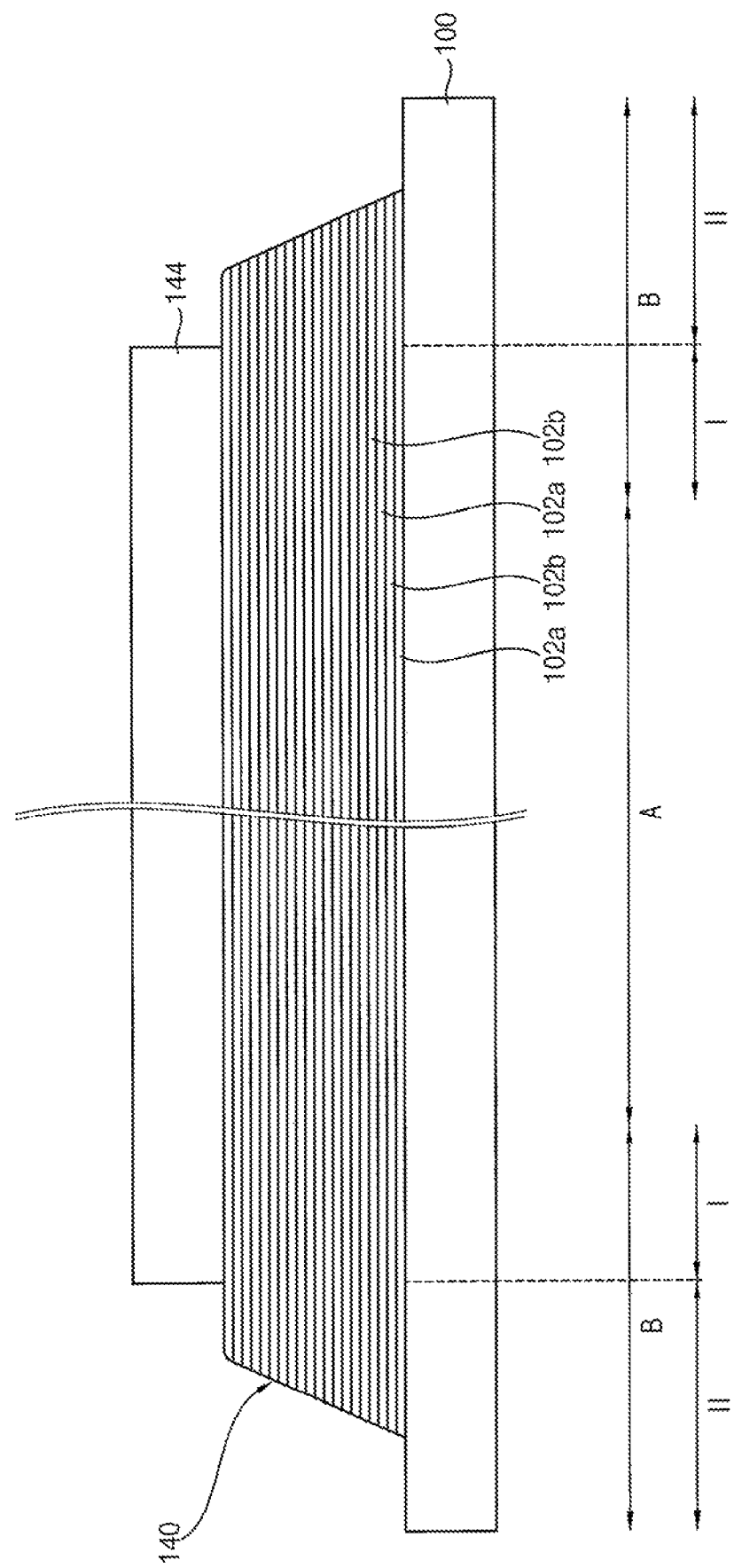

Referring to FIG. 16, a multi-layer 140 may be formed on the substrate 100 (e.g., on the first region I, the second region II, and the main region A of the substrate 100.

In an implementation, the multi-layer 140 may be formed by alternately depositing molybdenum/silicon (Mo/Si). In an implementation, the multi-layer 140 may be formed by alternately depositing molybdenum/beryllium (Mo/Be).

The multi-layer 140 is formed on the main region A and the first region I of the substrate 100, and an end of each of the layers included in the multi-layer 140 may have a thickness less than a thickness of other portion thereof. In an implementation, the multi-layer 140 may have an oblique or inclined sidewall slope with respect to the surface of the substrate 100.

A photoresist layer may be coated on the multi-layer 140. The photoresist layer may be patterned to form a photoresist pattern 144 on the multi-layer 140. The photoresist pattern 144 may cover an upper surface of the multi-layer 140 on the main region A and the first region I (e.g., a portion of the edge region B). A surface of the multi-layer 140 overlying the second region II may be exposed by (e.g., may not be covered by) the photoresist pattern 144.

Figure 17:
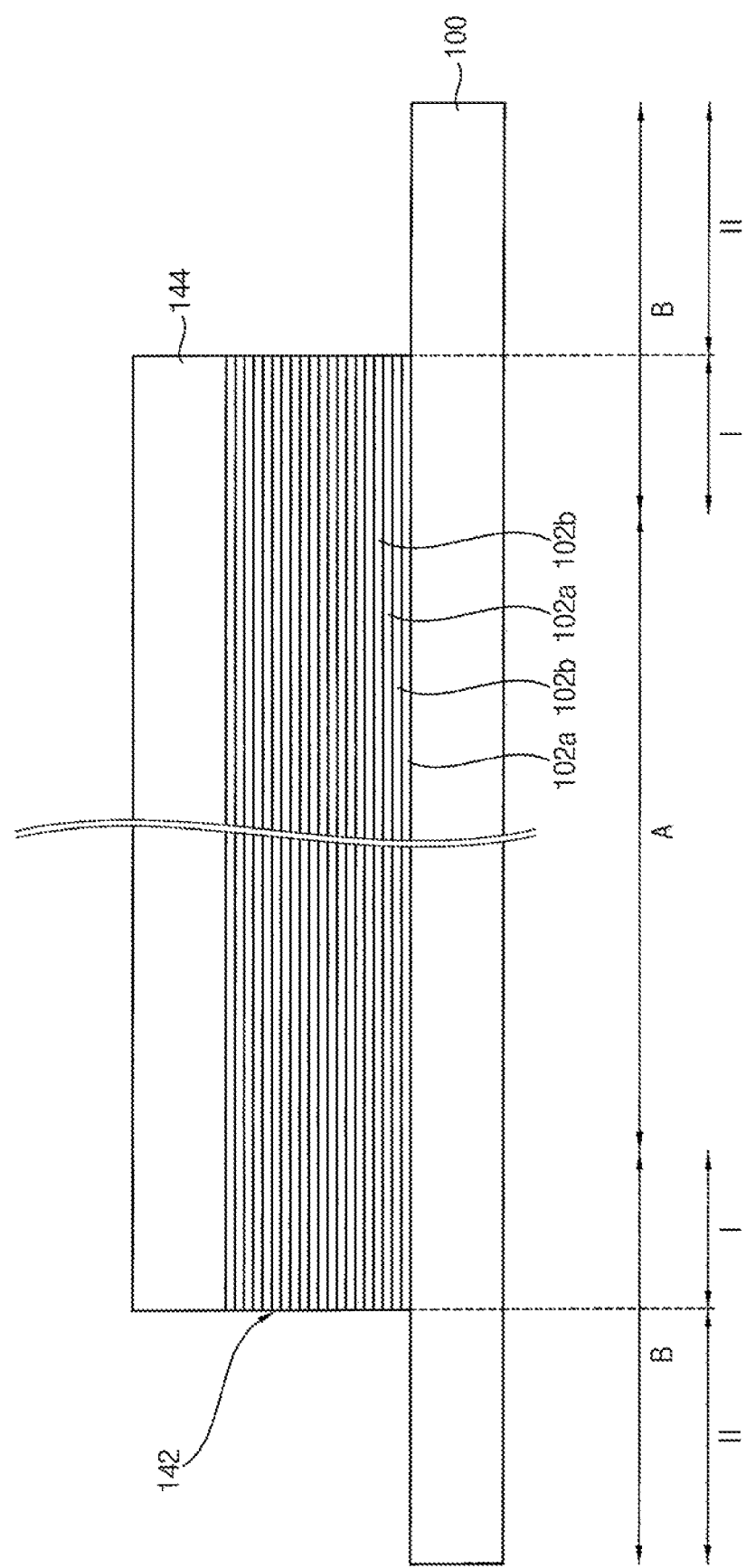

Referring to FIG. 17, the multi-layer 140 may be etched using the photoresist pattern 144 as an etching mask to form a multi-layer structure 142.

In an implementation, a sidewall of the multi-layer structure 142 may be perpendicular to an upper surface of the substrate 100.

In an implementation, the multi-layer structure 142 may be on an entire upper surface of the main region A of the substrate 100. An end of the multi-layer structure 142 may be on the first region I. In an implementation, a sidewall of the multi-layer structure 142 may be on the first region I (e.g., may be aligned with an outer edge of the first region I).

In an implementation, the multi-layer structure 142 may be formed so that a shortest distance from an end of the multi-layer structure 142 to an end of the substrate 100 may be 2.0 mm or less. In an implementation, the shortest distance from the end of the multi-layer structure 142 to the end of the substrate 100 may be 1.8 mm to 2.0 mm.

Thereafter, the photoresist pattern 144 may be removed.

Figure 18:
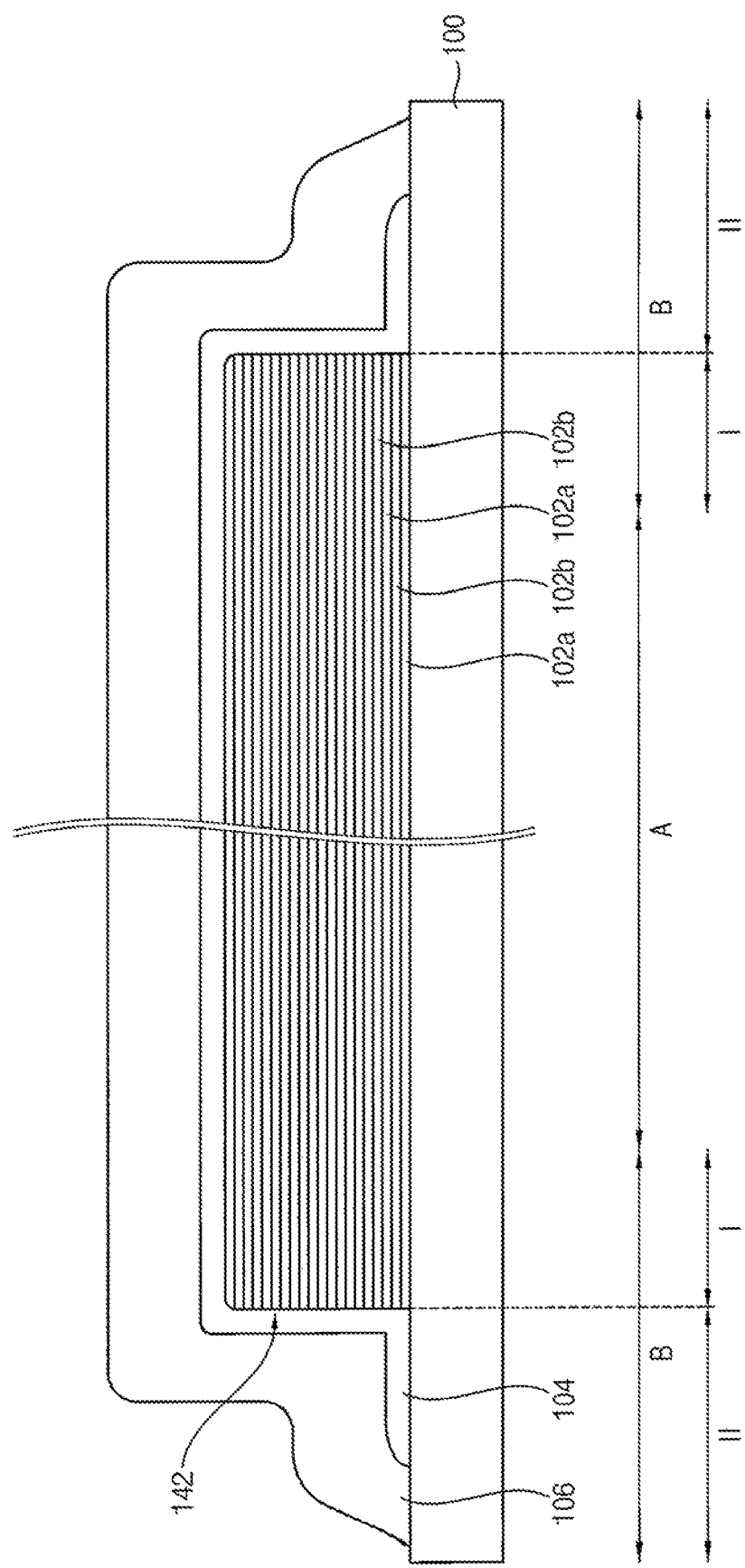

Referring to FIG. 18, a preliminary capping layer 104 may be formed to cover a surface of the multi-layer structure 142 and at least a portion of the second region II of the substrate 100. A preliminary absorber layer 106 may be formed to cover the preliminary capping layer 104 and at least a portion of an exposed surface of second region II of the substrate 100.

The processes may be substantially the same as illustrated with reference to FIGS. 6 and 7.

Figure 19:
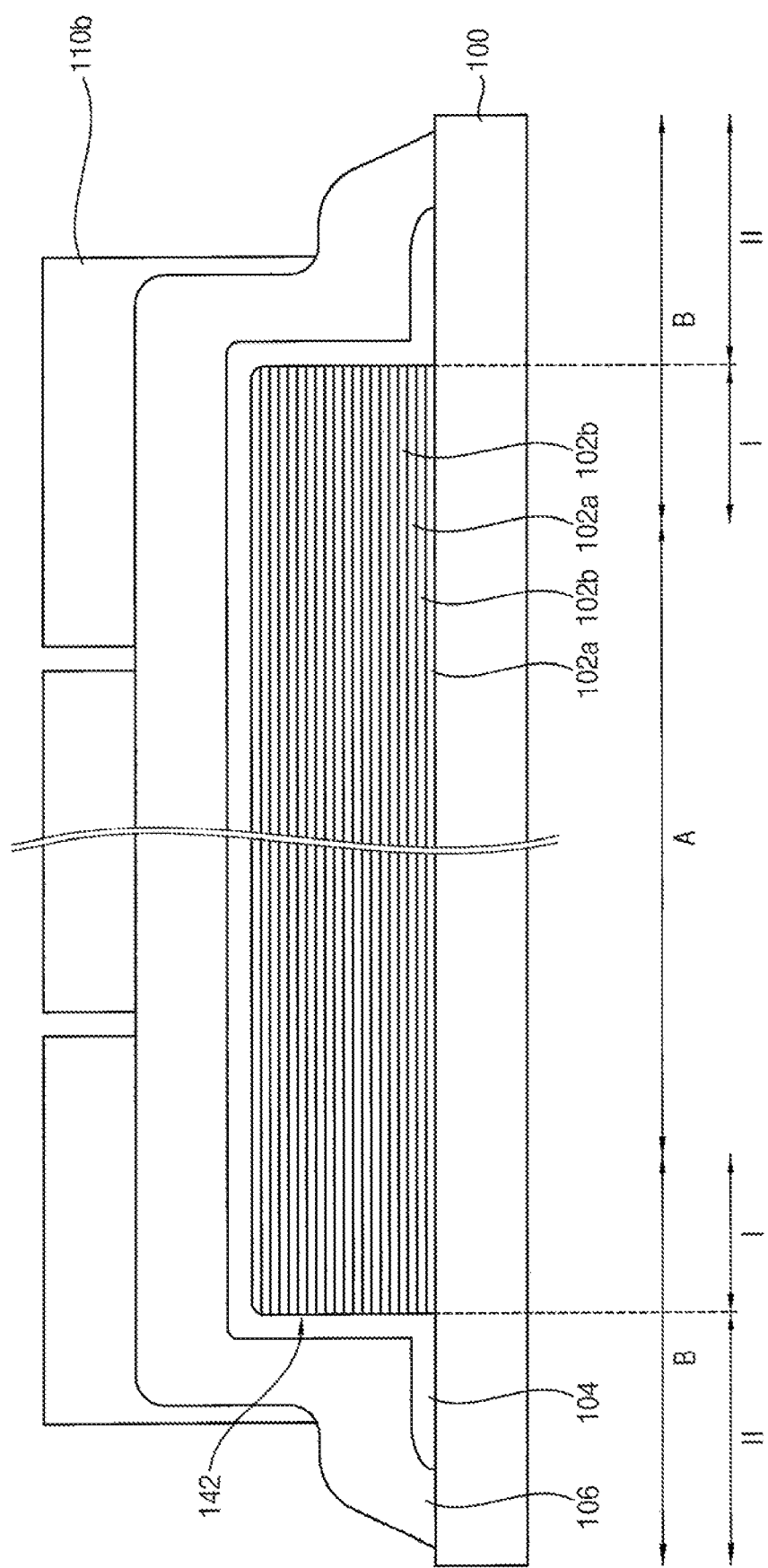

Referring to FIG. 19, a preliminary first photoresist layer may be coated to cover the preliminary absorber layer 106 and the substrate 100. A first EBR process may be performed on the preliminary first photoresist layer to form a first photoresist layer. Thereafter, a first photoresist pattern 110b may be formed by performing a photo process on the first photoresist layer.

The processes may be substantially the same as illustrated with reference to FIGS. 8 to 10.

Figure 20:
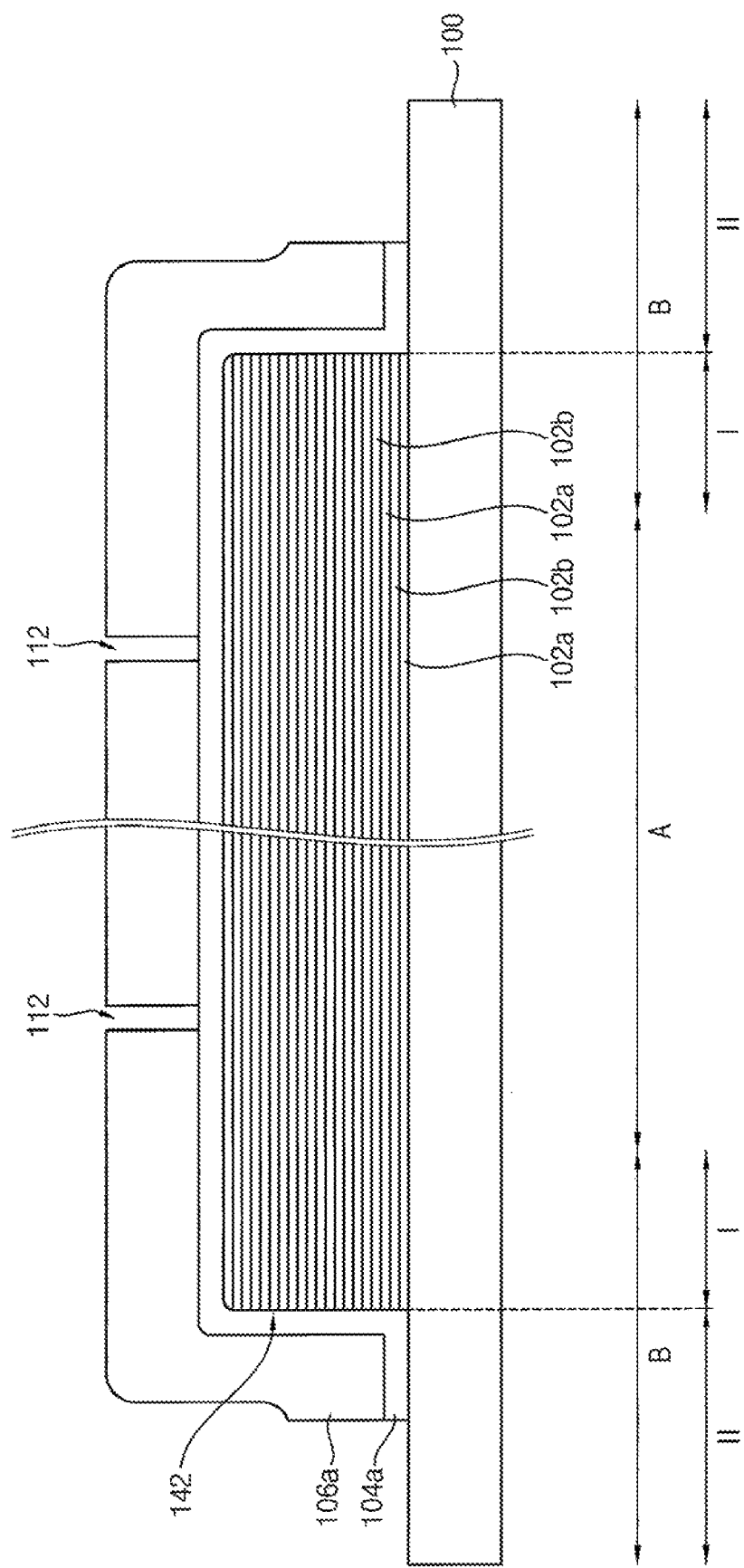

Referring to FIG. 20, the preliminary absorber layer 106 and the preliminary capping layer 104 on the second region II and the preliminary absorber layer 106 on the main region A may be etched using the first photoresist pattern 110b as an etching mask to form an absorber layer 106a and a capping layer 104a.

The process may be substantially the same as illustrated with reference to FIG. 11.

A portion of the preliminary absorber layer 106 on the main region A may be etched to form alignment key patterns 112.

A sidewall of the stacked structures of the capping layer 104a and the absorber layer 106a on the edge region B of the substrate 100 may have a vertical slope relative to an upper surface of the substrate 100. A sidewall of the capping layer 104a may have no protruding portion, and may have excellent roughness.

Referring to FIG. 21, a preliminary second photoresist layer may be coated to cover the absorber layer 106a and the substrate 100. A second EBR process may be performed on the preliminary second photoresist layer to form a second photoresist layer. Thereafter, a second photoresist pattern 120b may be formed by performing a photo process on the second photoresist layer.

The process may be substantially the same as illustrated with reference to FIGS. 12 to 14.

Referring to FIG. 15 again, the absorber layer 106a may be etched using the second photoresist pattern 120b as an etching mask to form a reticle.

By way of summation and review, in an exposure process using an apparatus for EUV exposure, electrical arcing could occur at a portion of a reticle (e.g., an exposure mask) due to a strong electric field between an electrostatic chuck and the reticle.

One or more embodiments may provide a reticle in an apparatus for EUV exposure having reduced defects and high durability.

One or more embodiments may provide methods of manufacturing the reticle in the apparatus for EUV exposure.

In accordance with example embodiments, the capping layer positioned at an edge portion of the reticle may have good roughness. Therefore, even though a strong electric field may be generated between an electrostatic chuck and the reticle during EUV exposure process, a high electric field may not be applied to the edge portion of the capping layer. An electrical arcing at the portion edge of the capping layer may be decreased.

In addition, the capping layer and the absorber layer may cover the sidewall of the multi-layer structure and an edge portion of the substrate adjacent thereto. The absorber layer may be formed on the capping layer, and the absorber layer may protect the edge portion of the reticle during cleaning of the reticle. Therefore, a durability of the reticle may be increased.

In the reticle, a sidewall of the multi-layer structure may have a vertical slope.

An electrical arcing of the reticle may decrease. Further, the reticle may have excellent durability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reticle for an apparatus for EUV exposure, the reticle comprising:
    a substrate including an edge region and a main region;
    a multi-layer structure on the main region and a portion of the edge region of the substrate, a sidewall of the multi-layer structure overlying the edge region of the substrate;
    a capping layer covering an upper surface and the sidewall of the multi-layer structure and at least a portion of the edge region of the substrate; and
    an absorber layer on the capping layer, the absorber layer covering an entire upper surface of the capping layer on the edge region of the substrate,
    wherein:
    a stacked structure of the capping layer and the absorber layer is on an upper surface of the edge region of the substrate, and
    a sidewall of the stacked structure of the capping layer and the absorber layer is perpendicular to an upper surface of the substrate.

2. The reticle as claimed in claim 1, wherein the sidewall of the multi-layer structure is inclined with respect to a surface of the substrate.

3. The reticle as claimed in claim 1, wherein a thickness of the absorber layer is greater than a thickness of the capping layer.

4. The reticle as claimed in claim 3, wherein:
    the thickness of the absorber layer is 40 nm to 80 nm, and
    the thickness of the capping layer is 1 nm to 10 nm.

5. The reticle as claimed in claim 1, wherein a shortest distance from an end of the multi-layer structure to an end of the substrate is 1.8 mm to 2.0 mm.

6. The reticle as claimed in claim 1, wherein an end of the stacked structure of the capping layer and the absorber layer is between an end of the multi-layer structure and an end of the substrate.

7. The reticle as claimed in claim 1, wherein the absorber layer covers the entire upper surface of the capping layer on the upper surface of the multi-layer structure, the sidewall of the multi-layer structure, and the upper surface of the edge region of the substrate.

8. The reticle as claimed in claim 1, wherein the capping layer includes non-compounded ruthenium or a material including ruthenium and silicon.

9. The reticle as claimed in claim 1, wherein the absorber layer includes non-compounded tantalum, a tantalum compound, molybdenum, palladium, zirconium, nickel silicide, non-compounded titanium, titanium nitride, non-compounded chromium, chromium oxide, aluminum oxide, or an aluminum-copper alloy.

10. The reticle as claimed in claim 1, wherein the multi-layer structure has a structure in which sets of a molybdenum layer/silicon layer are repeatedly stacked or a structure in which sets of a molybdenum layer/beryllium layer are repeatedly stacked.

11. A reticle for an apparatus for EUV exposure, the reticle comprising:
a substrate including an edge region and a main region;
a multi-layer structure on the main region and a portion of the edge region of the substrate, a sidewall of the multi-layer structure overlying the edge region of the substrate;
a capping layer covering an upper surface and the sidewall of the multi-layer structure and at least a portion of the edge region of the substrate; and
an absorber layer on the capping layer, the absorber layer covering an entire upper surface of the capping layer on the upper surface of the multi-layer structure, the sidewall of the multi-layer structure, and the edge region of the substrate,
wherein a shortest distance from an end of the multi-layer structure to an end of the substrate is 1.8 mm to 2.0 mm.

12. The reticle as claimed in claim 11, wherein an end of a stacked structure of the capping layer and the absorber layer is between the end of the multi-layer structure and the end of the substrate.

13. The reticle as claimed in claim 11, wherein the sidewall of the multi-layer structure is inclined with respect to a surface of the substrate.

14. The reticle as claimed in claim 11, wherein:
a stacked structure of the capping layer and the absorber layer is on an upper surface of the edge region of the substrate, and
a sidewall of the stacked structure of the capping layer and the absorber layer is perpendicular to an upper surface of the substrate.

15. The reticle as claimed in claim 11, wherein:
a thickness of the absorber layer is 40 nm to 80 nm, and
a thickness of the capping layer is 1 nm to 10 nm.

16. A reticle for an apparatus for EUV exposure, the reticle comprising:
a substrate;
a multi-layer structure on the substrate;
a capping layer covering an upper surface and a sidewall of the multi-layer structure and an upper surface of an edge region of the substrate; and
an absorber layer on the capping layer,
wherein the absorber layer covers an entire upper surface of the capping layer on the sidewall of the multi-layer structure and the edge region of the substrate.

17. The reticle as claimed in claim 16, wherein:
a stacked structure of the capping layer and the absorber layer is on the upper surface of the edge region of the substrate, and
a sidewall of the stacked structure of the capping layer and the absorber layer is perpendicular to an upper surface of the substrate.

18. The reticle as claimed in claim 16, wherein a shortest distance from an end of the multi-layer structure to an end of the substrate is 1.8 mm to 2.0 mm.

19. The reticle as claimed in claim 16, wherein an end of a stacked structure of the capping layer and the absorber layer is between the end of the multi-layer structure and the end of the substrate.

20. The reticle as claimed in claim 16, wherein:
a thickness of the absorber layer is 40 nm to 80 nm, and
a thickness of the capping layer is 1 nm to 10 nm.

* * * * *